(12) United States Patent
Sato

(10) Patent No.: US 6,787,282 B2
(45) Date of Patent: Sep. 7, 2004

(54) POSITIVE RESIST COMPOSITION

(75) Inventor: Kenichiro Sato, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/253,484

(22) Filed: Sep. 25, 2002

(65) Prior Publication Data

US 2003/0108809 A1 Jun. 12, 2003

(30) Foreign Application Priority Data

Sep. 28, 2001 (JP) .................................... P. 2001-301795

(51) Int. Cl.$^7$ ............................................. G03F 7/004
(52) U.S. Cl. ..................... 430/170; 430/270.1; 430/910
(58) Field of Search ............................ 430/170, 270.1, 430/910, 80

(56) References Cited

U.S. PATENT DOCUMENTS

| | | | |
|---|---|---|---|
| 6,544,715 B2 | * | 4/2003 | Sato et al. ................ 430/270.1 |
| 6,596,458 B1 | * | 7/2003 | Sato et al. ................ 430/270.1 |
| 6,703,178 B2 | * | 3/2004 | Chen et al. .................. 430/170 |
| 2001/0046641 A1 | * | 11/2001 | Uetani et al. ............. 430/270.1 |
| 2002/0169266 A1 | * | 11/2002 | Funaki et al. ................ 526/281 |

FOREIGN PATENT DOCUMENTS

| JP | 9-73173 | 3/1997 |
|---|---|---|
| JP | 9-90637 | 4/1997 |
| JP | 10-161313 | 6/1998 |
| JP | 11-109632 | 4/1999 |
| JP | 11-119434 | 4/1999 |
| JP | 3042618 | 3/2000 |

* cited by examiner

*Primary Examiner*—John S. Chu
(74) *Attorney, Agent, or Firm*—Sughrue Mion, PLLC

(57) ABSTRACT

A positive resist composition comprising (A) a resin, which increases a solubility rate in an alkali developing solution by the action of an acid, containing a repeating unit represented by formula (I) defined in the specification, a repeating unit represented by formula (II) defined in the specification and a repeating unit represented by formula (III) defined in the specification, and (B) a compound that generates an acid upon irradiation of an actinic ray or radiation.

15 Claims, No Drawings

POSITIVE RESIST COMPOSITION

FIELD OF THE INVENTION

The present invention relates to a positive photoresist composition sensitive to a far ultraviolet ray for use in fine fabrication, for example, semiconductor devices. More specifically, the present invention relates to a positive photoresist composition suitable for far ultraviolet ray exposure.

BACKGROUND OF THE INVENTION

The degree of integration of integrated circuits has recently become much higher, and the processing of ultrafine patterns having a line width of a half micron or below is required in the production of semiconductor substrate for VSLI. In order to meet such a requirement, a wavelength of light source used in an exposure apparatus for photolithography becomes shorter, and nowadays the use of an excimer laser beam (e.g., XeCl, KrF or ArF) in a short wavelength region of a far ultraviolet ray is investigated.

As a resist for use in the pattern formation by the photolithography in such a wavelength region, a chemically amplified resist is known.

In general, the chemically amplified resist is roughly divided into three types, i.e., the so-called two-component, two point five-component and three-component types. The chemically amplified resist of two-component type comprises a combination of a compound (hereinafter referred to as a "photo-acid generator" sometimes) capable of generating an acid by photolysis with a binder resin. The binder resin combined with the photo-acid generator is a resin having in its molecule, a group (hereinafter referred to as an "acid-decomposable group" sometimes) capable of being decomposed by the action of an acid to increase the solubility of resin in an alkali developing solution. The resist of two point five-component type further contains a low molecular weight compound having an acid-decomposable group in addition to the above described two components. The resist of three-component type contains a photo-acid generator, an alkali-soluble resin and the low molecular weight compound described above.

Although the chemically amplified resist described above is a photoresist suitable for exposure to an ultraviolet ray or a far ultraviolet ray, it is still necessary for the resist to meet requirements for characteristics from the standpoint of practical use.

As a photoresist composition for an ArF light source, a resin into which an alicyclic hydrocarbon moiety is incorporated is proposed for the purpose of improving dry etching resistance. However, the introduction of alicyclic hydrocarbon moiety is accompanied with a problem in that a system including the resin becomes extremely hydrophobic, and it is difficult to perform development with an aqueous solution of tetramethylammonium hydroxide (hereinafter referred to as TMAH sometimes), which has hitherto been widely employed as a developer for resist. Also, a phenomenon of releasing the resist film from a substrate during the development is observed.

Therefore, various investigations on introduction of hydrophilic group into the resin having alicyclic hydrocarbon moiety have been made.

Resist materials using an acid-sensitive compound containing an alkali-soluble group protected by a structure including an alicyclic group and a structure unit having a function of releasing the alkali-soluble group by an acid are described in JP-A-9-73173, JP-A-9-90637 and JP-A-10-161313 (the term "JP-A" as used herein means an "unexamined published Japanese patent application").

It is described in JP-A-11-109632 that a resin containing an alicyclic functional group having a polar group and an acid-decomposable group is used in a radiation-sensitive material.

A photoresist composition containing a polymer obtained by copolymerization of a (meth)acrylate derivative having a lactone structure with another polymerizable compound is described in Japanese Patent 3,042,618.

Improvements in resolution, sensitivity and dry etching resistance and low cost are attempted by using a resin containing a repeating unit wherein an alkali-soluble group is protected by a protective group including an alicyclic hydrocarbon group, a repeating unit wherein an alkali-soluble group is protected by a protective group other than the protective group including an alicyclic hydrocarbon group and a monomer unit having a lactone structure of from 10 to 35% by mole as described in JP-A-11-119434.

However, in any positive resist compositions hitherto known, problems including pattern collapsing due to insufficient adhesion and film strength, surface roughness after etching and pitch dependency, which occur accompanied with the desired miniaturization tendency of pattern, are not satisfactorily resolved.

SUMMARY OF THE INVENTION

Therefore, an object of the present invention is to provide a positive photosensitive composition in which the pattern collapsing, surface roughness after etching and pitch dependency are remarkably improved and which is preferably used in an ultramicrolithography process, for example, the production of VLSI and high capacity microtips, and in other photofabrication processes.

Other objects of the present invention will become apparent from the following description.

As a result of the intensive investigations on materials for chemically amplified positive resist compositions, it has been found that the objects of the present invention are accomplished by the positive resist compositions described below to complete the present invention.

1. A positive resist composition comprising (A) a resin, which increases a solubility rate in an alkali developing solution by the action of an acid, containing a repeating unit represented by formula (I) shown below, a repeating unit represented by formula (II) shown below and a repeating unit represented by formula (III) shown below, and (B) a compound that generates an acid upon irradiation of an actinic ray or radiation.

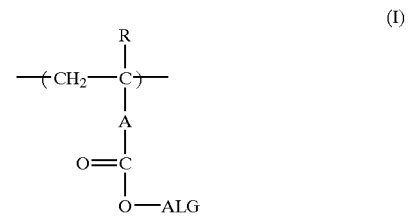

In formula (I), R represents a hydrogen atom or a methyl group; A represents a single bond or a connecting group; and ALG represents any one of the groups represented by the following formulae (pI) to (pV):

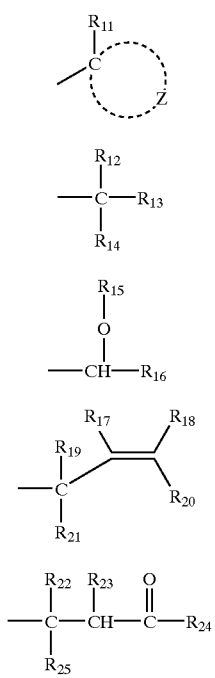

(pI)

(pII)

(pIII)

(pIV)

(pV)

In the above formulae, $R_{11}$ represents a methyl group, an ethyl group, an n-propyl group, an isobutyl group or a sec-butyl group; Z represents an atomic group necessary for forming an alicyclic hydrocarbon group together with the carbon atom; $R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group; $R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring;

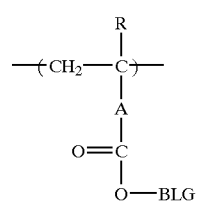

(II)

In formula (II) R represents a hydrogen atom or a methyl group; A represents a single bond or a connecting group; and BLG represents a chain tertiary alkyl group;

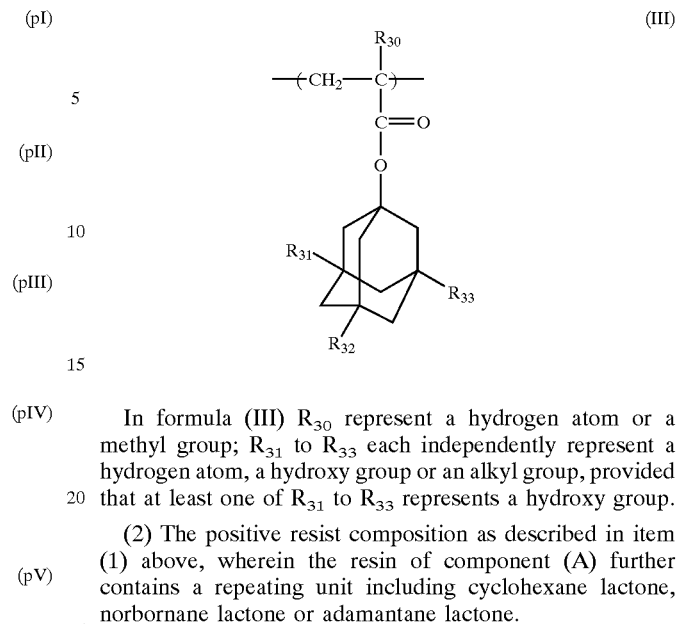

(III)

In formula (III) $R_{30}$ represent a hydrogen atom or a methyl group; $R_{31}$ to $R_{33}$ each independently represent a hydrogen atom, a hydroxy group or an alkyl group, provided that at least one of $R_{31}$ to $R_{33}$ represents a hydroxy group.

(2) The positive resist composition as described in item (1) above, wherein the resin of component (A) further contains a repeating unit including cyclohexane lactone, norbornane lactone or adamantane lactone.

(3) The positive resist composition as described in item (1) or (2) above, wherein two of $R_{31}$ to $R_{33}$ in the repeating unit represented by formula (III) each represent a hydroxy group.

(4) The positive resist composition as described in any one of items (1) to (3) above, wherein A and ALG in formula (I) represent a single bond and a group represented by a formula shown below, respectively.

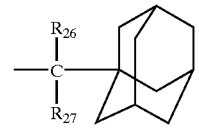

wherein $R_{26}$ to $R_{27}$ each independently represent a straight chain or branched alkyl group having from 1 to 4 carbon atoms.

DETAILED DESCRIPTION OF THE INVENTION

Components for use in the positive resist composition according to the present invention will be described in more detail below.

[1] (A) Resin Increasing a Solubility Rate in an Alkali Developing Solution by the Action of an Acid (Hereinafter, also Referred to as an "Acid-decomposable Resin")

The resin of component (A) has a requisite for containing the repeating unit including an acid-decomposable group represented by formula (I) described above. In formula (I), R represents a hydrogen atom or a methyl group, A represents a single bond or a connecting group, and ALG represents a group including an alicyclic hydrocarbon moiety represented by any one of formulae (pI) to (pV) described above.

The connecting group for A includes an alkylene group, a substituted alkylene group, an ether group, a thioether group, a carbonyl group, an ester group, an amido group, a sulfonamido group, a urethane group, a urea group and a combination of two or more thereof.

Examples of the alkylene group or substituted alkylene group represented by A include a group represented by the following formula:

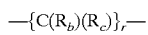      5

In the formula, $R_b$ and $R_c$, which may be the same or different, each represent a hydrogen atom, an alkyl group, a substituted alkyl group, a halogen atom, a hydroxy group or an alkoxy group, and r represents an integer of from 1 to 10.

The alkyl group represented by $R_b$ or $R_c$ includes preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group (preferably having from 1 to 4 carbon atoms). The alkoxy group represented by $R_b$ or $R_c$ includes an alkoxy group having from 1 to 4 carbon atoms, for example, methoxy, ethoxy, propoxy or butoxy group. The halogen atom represented by $R_b$ or $R_c$ includes chlorine, bromine, fluorine and iodine atom.

In formulae (pI) to (pV), the alkyl group for $R_{12}$ to $R_{25}$ includes a straight chain or branched alkyl group having from 1 to 4 carbon atoms, which may be substituted. Examples of the alkyl group include methyl, ethyl, n-propyl, isopropyl, n-butyl, isobutyl, sec-butyl and tert-butyl groups.

Examples of the substituent for the alkyl group include an alkoxy group having from 1 to 4 carbon atoms, a halogen atom (e.g., fluorine, chlorine, bromine or iodine atom), an acyl group, an acyloxy group, a cyano group, a hydroxy group, a carboxy group, an alkoxycarbonyl group and a nitro group.

The alicyclic hydrocarbon group in $R_{11}$ to $R_{25}$ or the alicyclic hydrocarbon group formed by Z and the carbon atoms may be a monocyclic group or a polycyclic group, and includes specifically a group having not less than 5 carbon atoms and including, for example, a monocyclo, bicyclo, tricyclo or tetracyclo structure. The number of carbon atoms included is preferably from 6 to 30, and more preferably from 7 to 25. The alicyclic hydrocarbon group may have a substituent.

Examples of the structure of alicyclic portion in the alicyclic hydrocarbon group are set forth below.

 (1)

 (2)

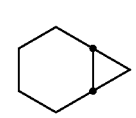 (3)

 (4)

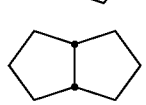 (5)

-continued

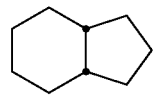 (6)

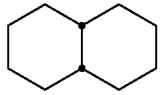 (7)

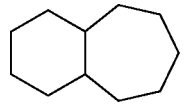 (8)

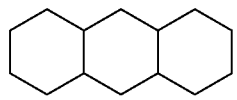 (9)

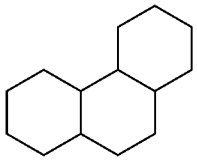 (10)

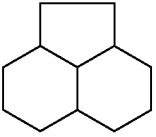 (11)

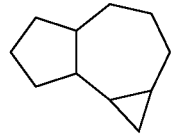 (12)

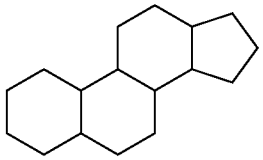 (13)

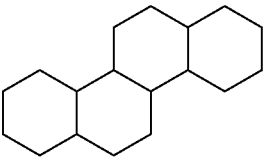 (14)

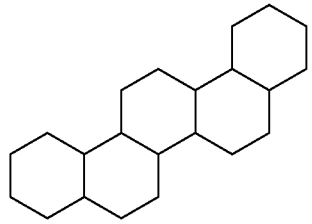 (15)

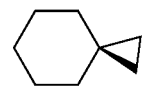 (16)

(17) 
(18) 
(19) 
(20) 
(21) 
(22) 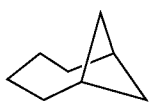
(23) 
(24) 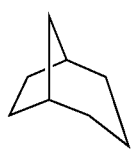
(25) 
(26) 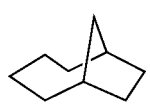
(27) 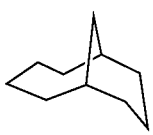
(28) 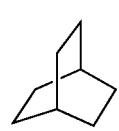
(29) 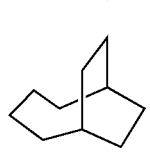
(30) 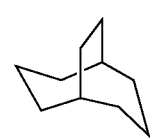
(31) 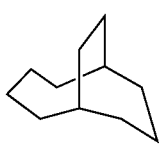
(32) 
(33) 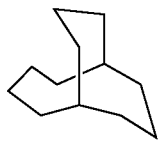
(34) 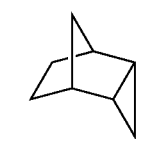
(35) 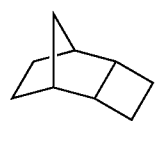
(36) 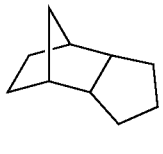
(37) 
(38) 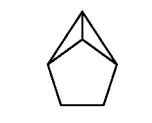
(39) 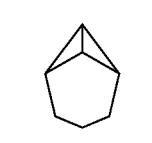
(40) 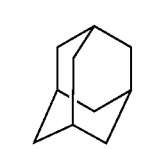

(41) 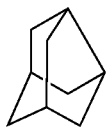

(42) 

(43) 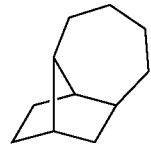

(44) 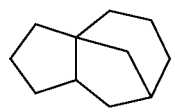

(45) 

(46) 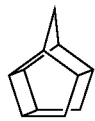

(47) 

(48) 

(49) 

(50) 

Preferred examples of the alicyclic portion for use in the present invention include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Of these groups, an adamantyl group, a decalin residue, a norbornyl group, a cedrol group, a cyclohexyl group, a cycloheptyl group, a cyclooctyl group, a cyclodecanyl group, a cyclododecanyl group and a tricyclodecanyl group are more preferred.

Examples of the substituent for the alicyclic hydrocarbon group include an alkyl group, a substituted alkyl group, a halogen atom, a hydroxy group, an alkoxy group, a carboxy group and an alkoxycarbonyl group.

The alkyl group is preferably a lower alkyl group, for example, methyl, ethyl, propyl, isopropyl or butyl group, and more preferably methyl, ethyl, propyl or isopropyl group.

Examples of the substituent for the substituted alkyl group include a hydroxy group, a halogen atom and an alkoxy group.

The alkoxy group includes an alkoxy group having from 1 to 4 carbon atoms, for example, methoxy, ethoxy, propoxy or butoxy group.

A repeating unit represented by formula (I) wherein A represents a single bond and ALG represents a group shown below is particularly preferred in view of good profile stability (SEM resistance) when the profile obtained is observed by a scanning electron microscope.

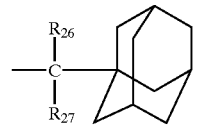

wherein $R_{26}$ to $R_{27}$ each independently represent a straight chain or branched alkyl group having from 1 to 4 carbon atoms.

Specific examples of monomer corresponding to the repeating unit represented by formula (I) are set forth below, but the present invention should not be construed as being limited thereto.

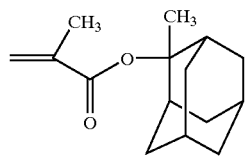

1

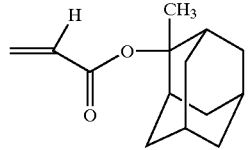

2

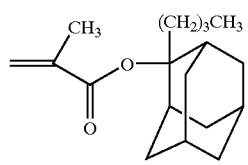

3

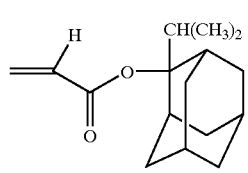

4

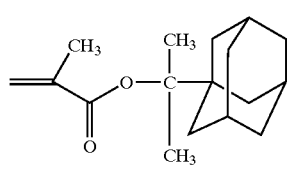

5

-continued
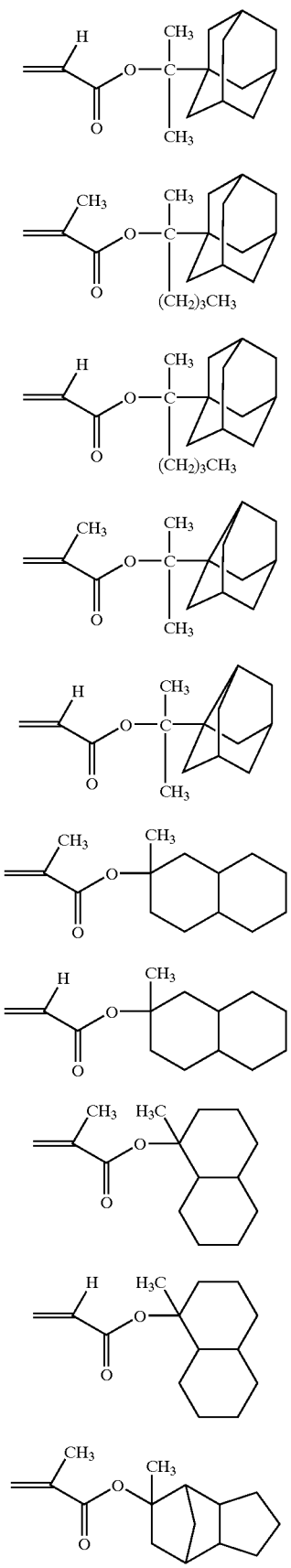
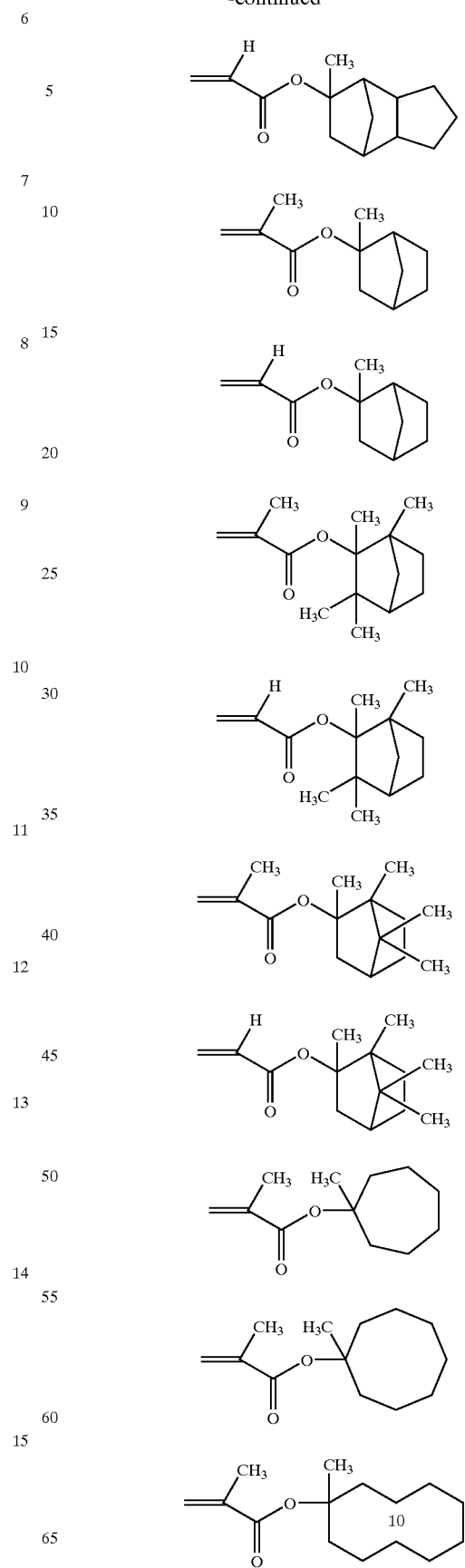

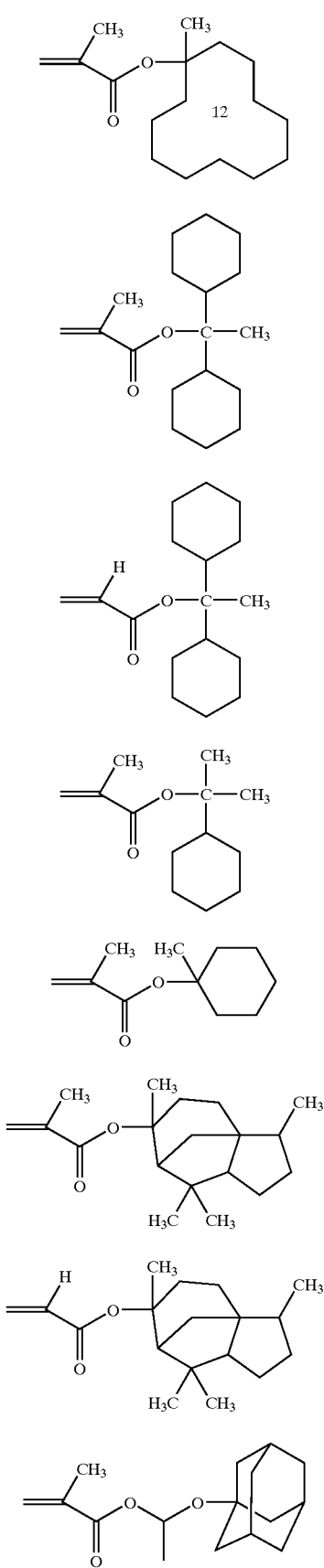
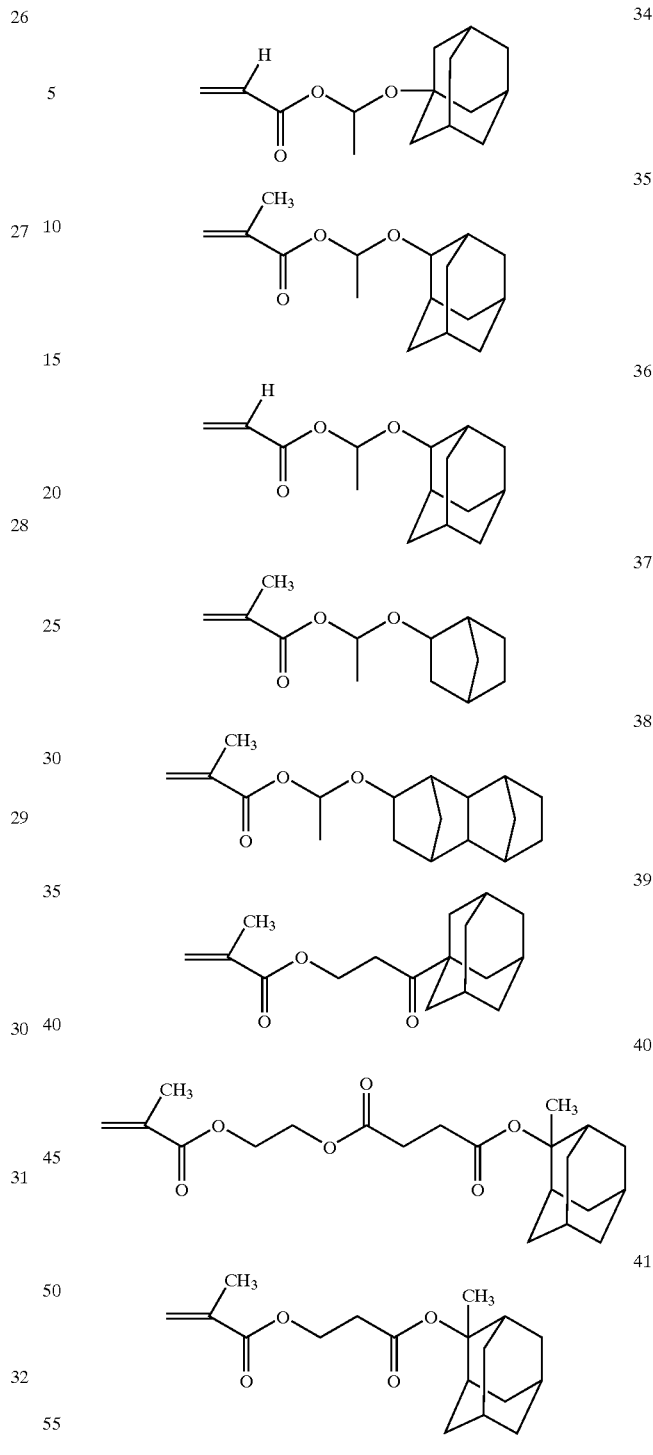

The repeating unit represented by formula (II) is described in detail below.

In formula (II), R and A have the same meaning as defined for R and A in formula (I), respectively.

BLG in formula (II) represents a chain tertiary alkyl group, and is represented, for example, by —C(Ra)(Rb)(Rc). In the formula, Ra, Rb and Rc each independently represent a straight chain or branched alkyl group (ordinarily having from 1 to 20 carbon atoms, preferably having from 1 to 10 carbon atoms, more preferably having from 1 to 5 carbon atoms, and including, for example, methyl, ethyl, straight chain or branched propyl, straight chain or branched butyl or straight chain or branched pentyl group).

The alkyl group for Ra, Rb or Rc may have a substituent. Preferred examples of the substituent include a halogen atom, a hydroxy group an alkoxy group (preferably having from 1 to 10 carbon atoms, more preferably having from 1 to 5 carbon atoms).

Specific examples of the repeating unit represented by formula (II) are set forth below, but the present invention should not be construed as being limited thereto.

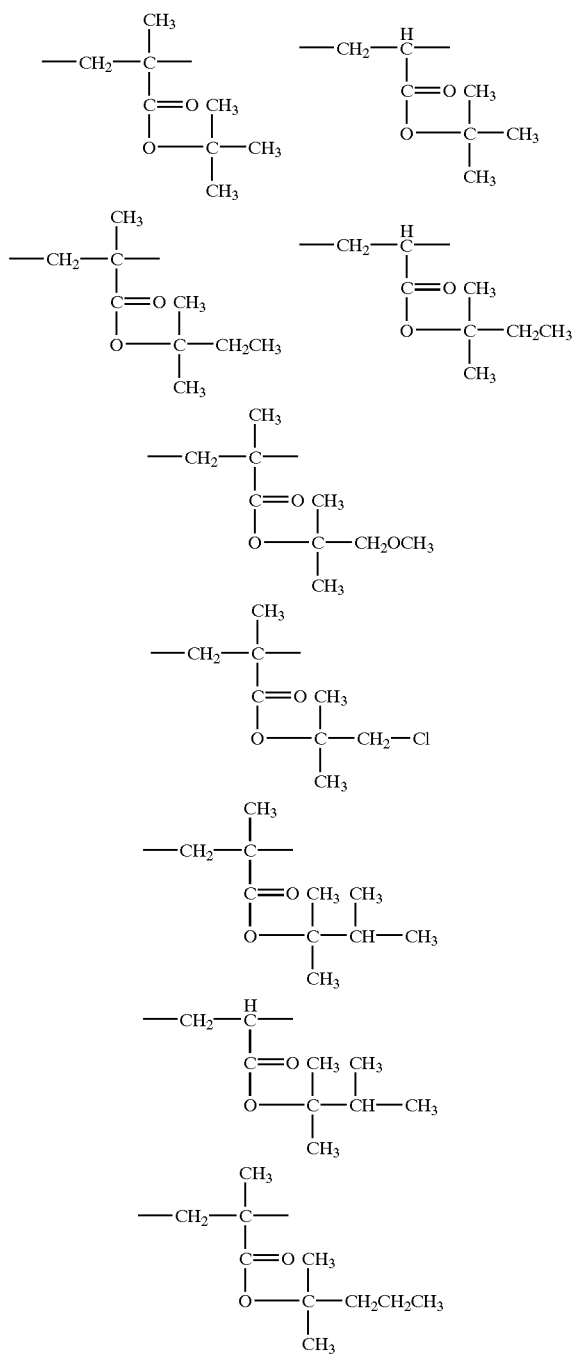

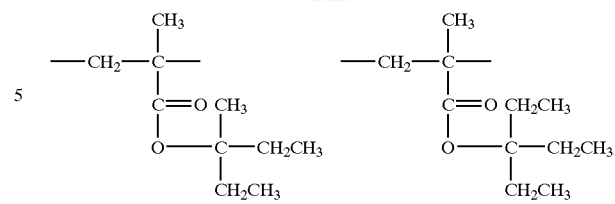

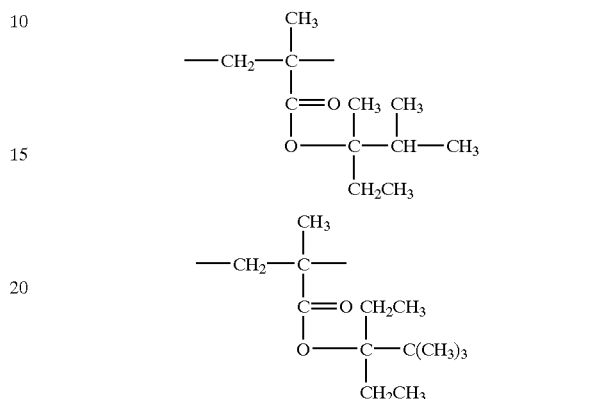

The repeating unit represented by formula (III) is described in detail below.

In formula (III), $R_{30}$ represent a hydrogen atom or a methyl group, $R_{31}$ to $R_{33}$ each independently represent a hydrogen atom, a hydroxy group or an alkyl group, provided that at least one of $R_{31}$ to $R_{33}$ represents a hydroxy group.

A repeating unit represented by formula (III) wherein two of $R_{31}$ to $R_{33}$ each represent a hydroxy group is particularly preferred in view of obtaining a broad exposure margin, particularly, broadly maintaining the exposure margin on under exposure side.

Specific examples of the repeating unit represented by formula (III) are set forth below, but the present invention should not be construed as being limited thereto.

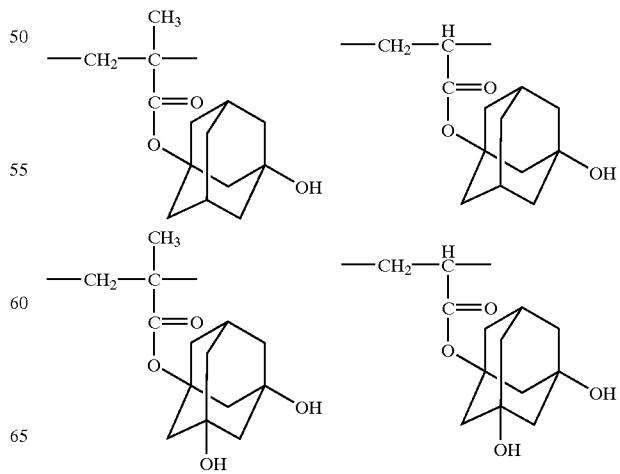

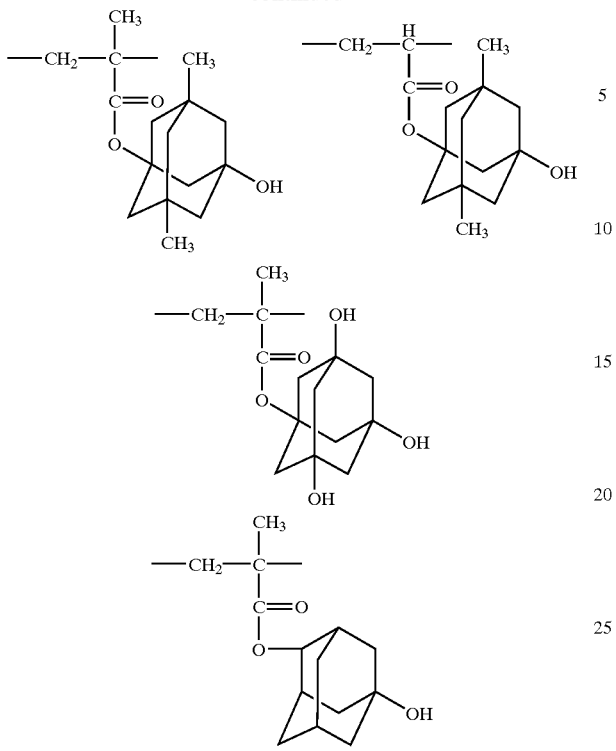

It is preferred that the resin of component (A) used in the positive resist composition of the present invention contains a repeating unit including an alicyclic lactone structure in order to further decrease the pattern collapsing and pitch dependency.

The repeating unit including an alicyclic lactone structure includes, for example, a repeating unit including cyclohexane lactone, norbornane lactone or adamantane lactone.

For example, the repeating unit including cyclohexane lactone includes a repeating unit having a group represented by formula (V-1) or (V-2) shown below. The repeating unit including norbornane lactone includes a repeating unit having a group represented by formula (V-3) or (V-4) shown below. The repeating unit including adamantane lactone includes a repeating unit represented by formula (VI) shown below.

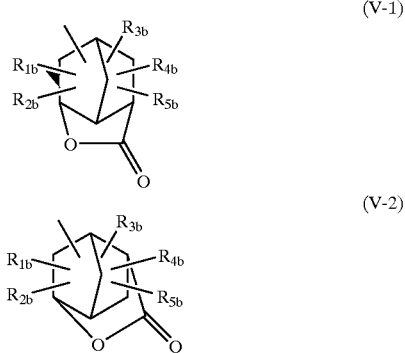

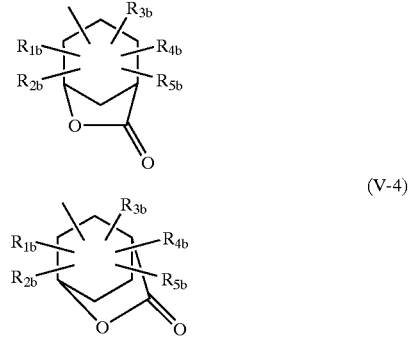

In formulae (V-1) to (V-4), $R_{1b}$, $R_{2b}$, $R_{3b}$, $R_{4b}$ and $R_{5b}$, which may be the same or different, each independently represent a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring.

The alkyl group represented by any one of $R_{1b}$, $R_{2b}$, $R_{3b}$, $R_{4b}$ and $R_{5b}$ in formulae (V-1) to (V-4) includes a straight chain or branched alkyl group which may be substituted. The straight chain or branched alkyl group includes preferably a straight chain or branched alkyl group having from 1 to 12 carbon atoms, more preferably a straight chain or branched alkyl group having from 1 to 10 carbon atoms, and still more preferably methyl, ethyl, propyl, isopropyl, n-butyl, isobutyl, sec-butyl, tert-butyl, pentyl, hexyl, heptyl, octyl, nonyl and decyl groups.

The cycloalkyl group represented by any one of $R_{1b}$, $R_{2b}$, $R_{3b}$, $R_{4b}$ and $R_{5b}$ in formulae (V-1) to (V-4) includes preferably a cycloalkyl group having from 3 to 8 carbon atoms, for example, cyclopropyl, cyclopentyl, cyclohexyl, cycloheptyl or cyclooctyl group.

The alkenyl group represented by any one of $R_{1b}$, $R_{2b}$, $R_{3b}$, $R_{4b}$ and $R_{5b}$ in formulae (V-1) to (V-4) includes preferably an alkenyl group having from 2 to 6 carbon atoms, for example, vinyl, propenyl, butenyl or hexenyl group.

The ring formed by combining two of $R_{1b}$, $R_{2b}$, $R_{3b}$, $R_{4b}$ and $R_{5b}$ in any one of formulae (V-1) to (V-4) includes preferably a 3-membered to 8-membered ring, for example, cyclopropane, cyclobutane, cyclopentane, cyclohexane or cyclooctane ring.

The group represented by $R_{1b}$, $R_{2b}$, $R_{3b}$, $R_{4b}$ and $R_{5b}$ in formulae (V-1) to (V-4) can be bonded to any one of the carbon atoms constituting the cyclic structure.

Preferred examples of the substituent for the alkyl group, cycloalkyl group and alkenyl group described above include an alkoxy group having from 1 to 4 carbon atoms, a halogen atom (e.g., fluorine, chlorine, bromine or iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of repeating unit having the group represented by any one of formulae (V-1) to (V-4) include a repeating unit represented by formula (AI) shown below.

$$\begin{array}{c} R_{b0} \\ -\!\!\!-\!\!(CH_2\!-\!\!\!\underset{|}{C})\!-\!\!\!- \\ O\!=\!\!\underset{|}{C} \\ \underset{|}{O} \\ A'\!-\!B_2 \end{array} \quad (AI)$$

In formula (AI), $R_{b0}$ represents a hydrogen atom, a halogen atom, a substituted or unsubstituted alkyl group having from 1 to 4 carbon atoms. Preferred examples of the substituent for the alkyl group represented by $R_{b0}$ include the preferred examples of substituent for the alkyl group represented by Rib in any one of formulae (V-1) to (V-4) described above.

The halogen atom represented by $R_{b0}$ includes fluorine, chlorine, bromine and iodine atoms. $R_{b0}$ is preferably a hydrogen atom.

A' in formula (AI) represents a single bond, an ether group, an ester group, a carbonyl group, an alkylene group or a divalent group formed by combining these groups.

$B_2$ in formula (AI) represents the group represented by any one of formulae (V-1) to (V-4).

Examples of the divalent group formed by combination represented by A' includes those represented by the following formulae:

$$-\!(CH_2CH_2\!-\!\underset{\underset{O}{\|}}{C}\!-\!O)_m\!- \quad -\!(\underset{\underset{R_{bb}}{|}}{\overset{R_{ab}}{|}}\!C)\!-\!O\!-\!\underset{\underset{O}{\|}}{C}\!-\!(\underset{\underset{R_{bb}}{|}}{\overset{R_{ab}}{|}}\!C)_{r1}\!-$$

$$-\!(\underset{\underset{R_{bb}}{|}}{\overset{R_{ab}}{|}}\!C)\!-\!O\!-\!(\underset{\underset{R_{bb}}{|}}{\overset{R_{ab}}{|}}\!C)_{r1}\!-$$

$$-\!(O\!-\!CH_2CH_2\!-\!\underset{\underset{O}{\|}}{C})_m\!-\!O\!-\!(\underset{\underset{R_{bb}}{|}}{\overset{R_{ab}}{|}}\!C)_{r1}\!-$$

$$-\!CH_2CH_2\!-\!O\!-\!\underset{\underset{O}{\|}}{C}\!-\!CH_2CH_2\!-\!\underset{\underset{O}{\|}}{C}\!-\!O\!-\!(\underset{\underset{R_{bb}}{|}}{\overset{R_{ab}}{|}}\!C)_{r1}\!-$$

In the above-described formulae, $R_{ab}$ and $R_{bb}$, which may be the same or different, each represent a hydrogen atom, an alkyl group, a substituted alkyl group, a halogen atom, a hydroxy group or an alkoxy group.

The alkyl group represented by any one of $R_{ab}$ and $R_{bb}$ is preferably a lower alkyl group, for example, methyl, ethyl, propyl, isopropyl or butyl group, more preferably methyl, ethyl, propyl or isopropyl group. A substituent for the substituted alkyl group includes a hydroxy group, a halogen atom and an alkoxy group having from 1 to 4 carbon atoms.

The alkoxy group includes an alkoxy group having from 1 to 4 carbon atoms, for example, methoxy, ethoxy, propoxy or butoxy group.

The halogen atom includes chlorine, bromine, fluorine and iodine atoms.

r1 represents an integer of from 1 to 10, and preferably from 1 to 4. m represents an integer of from 1 to 3, preferably 1 or 2.

Specific examples of the repeating unit represented by formula (AI) are set forth below, but the present invention should not be construed as being limited thereto.

(Ib-1)

(Ib-2)

(Ib-3)

(Ib-4)

(Ib-5)

(Ib-6)

(Ib-7)
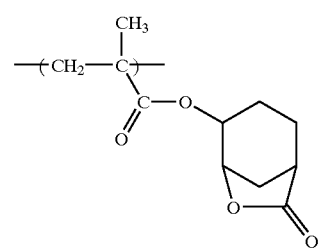
(Ib-8)
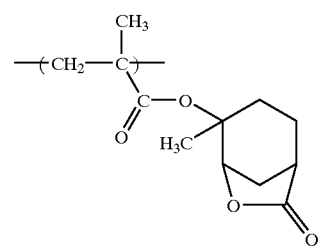
(Ib-9)
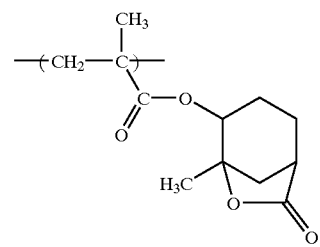
(Ib-10)
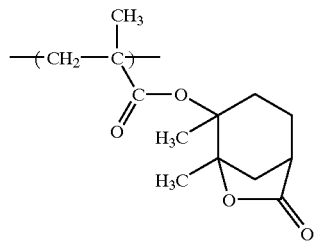
(Ib-11)
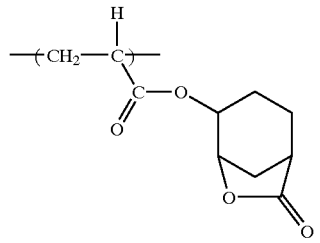
(Ib-12)
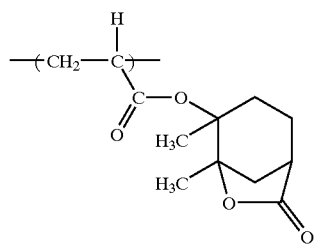
(Ib-13)
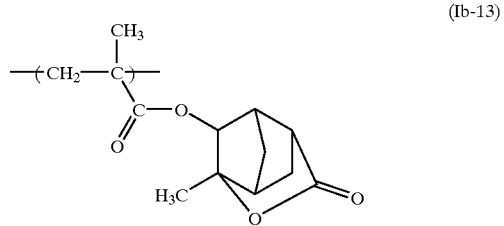
(Ib-14)
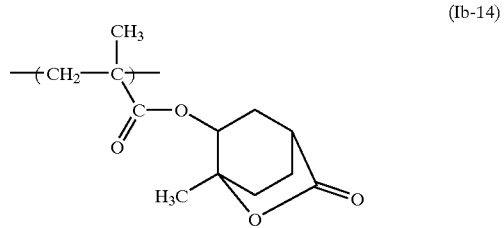
(Ib-15)
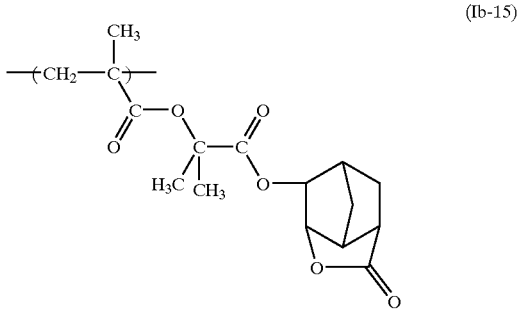
(Ib-16)
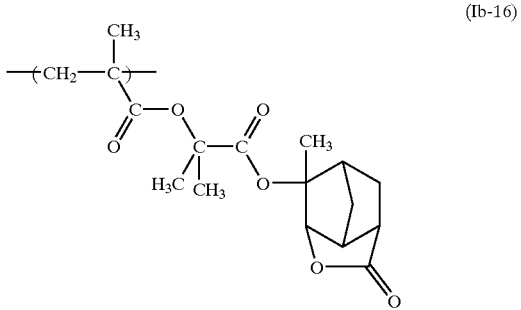
(Ib-17)
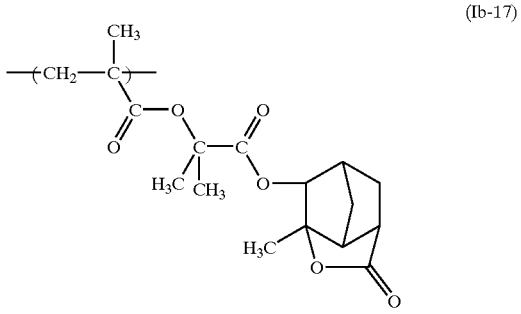
(Ib-18)
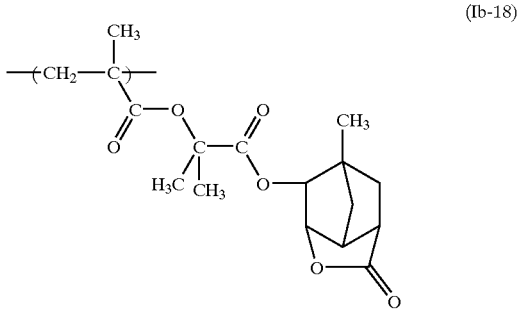

(Ib-19) 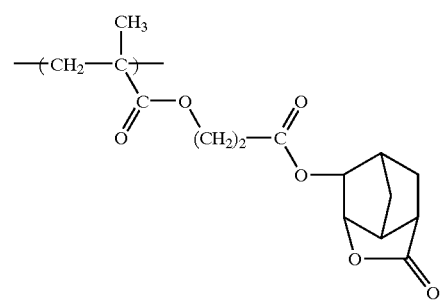
(Ib-20) 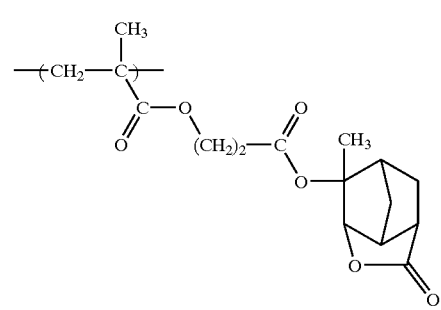
(Ib-21) 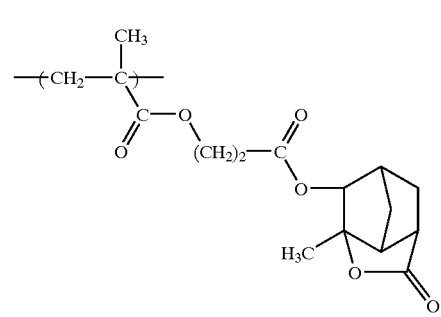
(Ib-22) 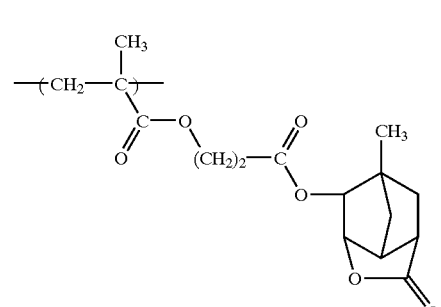
(Ib-23) 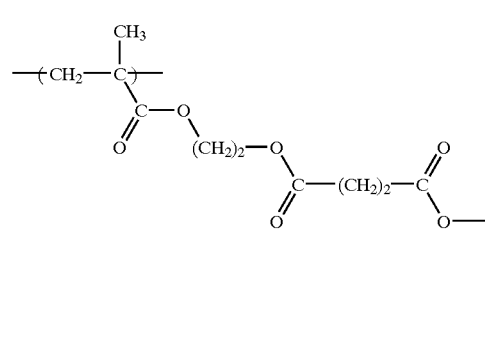
(Ib-24) 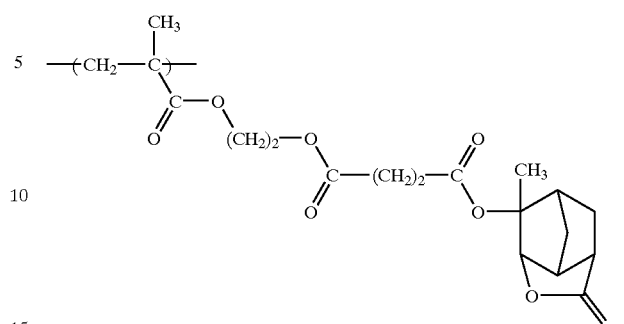
(Ib-25) 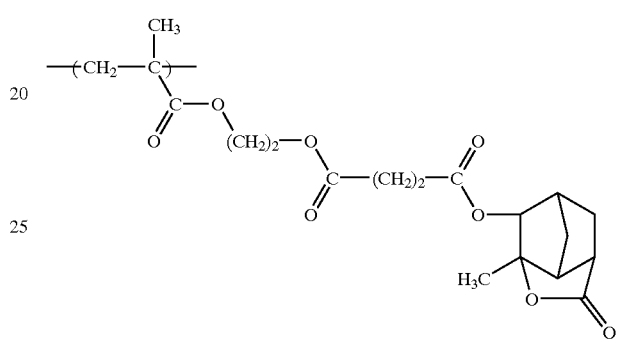
(Ib-26) 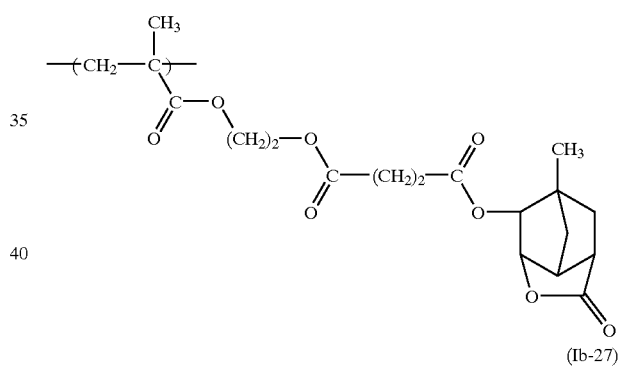
(Ib-27) 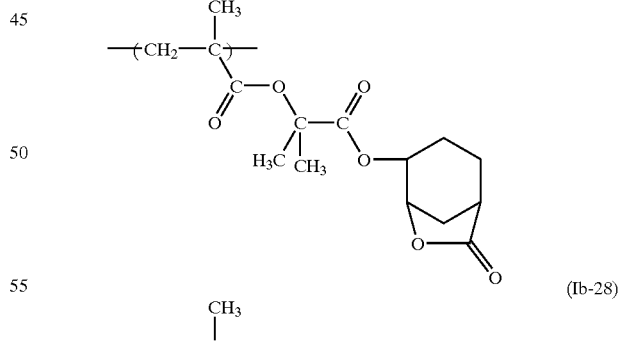
(Ib-28) 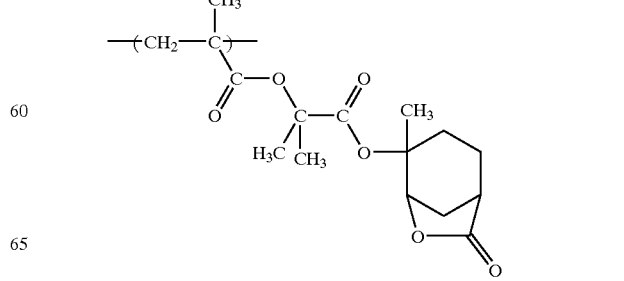

(Ib-29) 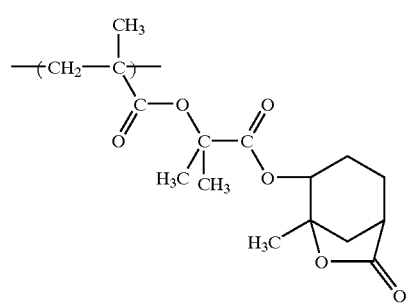
(Ib-30) 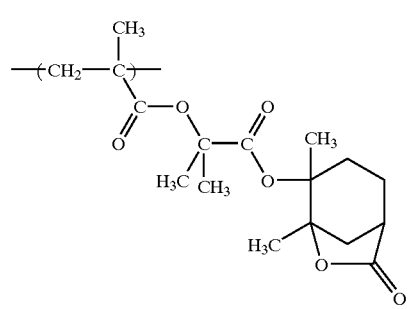
(Ib-31) 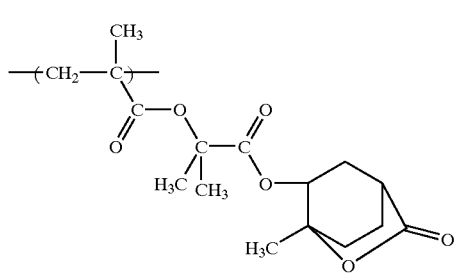
(Ib-32) 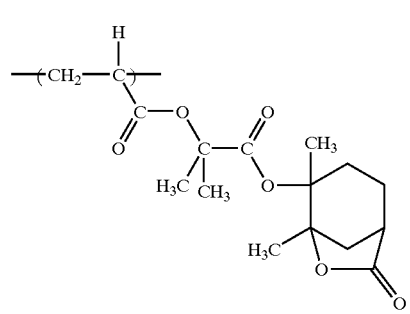
(Ib-33) 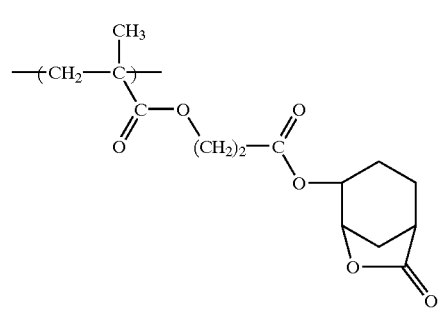
(Ib-34) 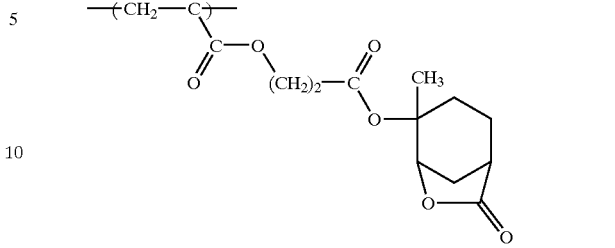
(Ib-35) 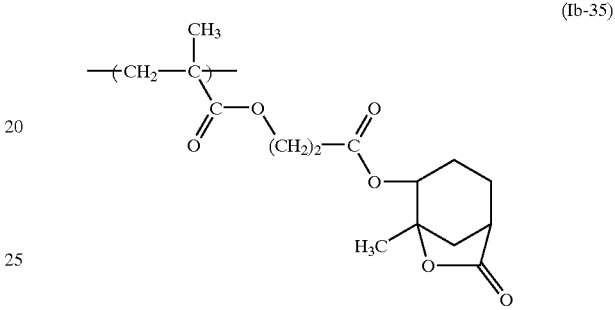
(Ib-36) 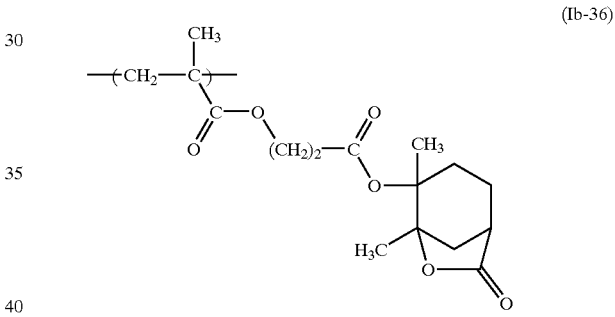
(Ib-37) 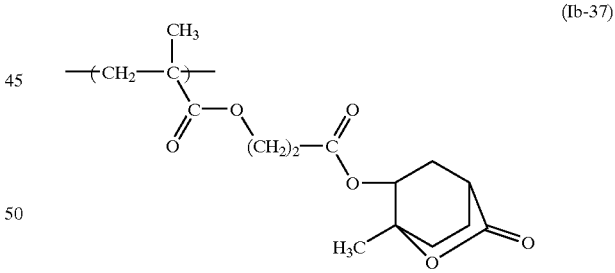
(Ib-38) 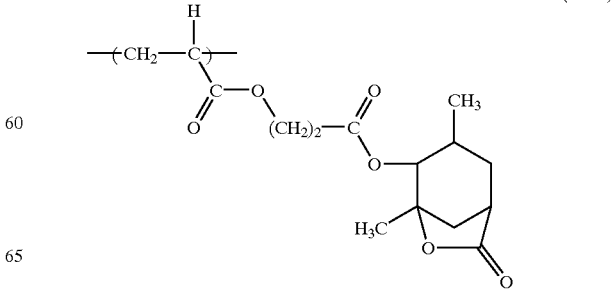

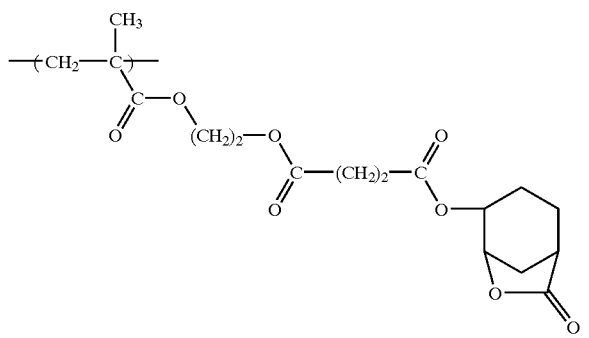

(Ib-39)

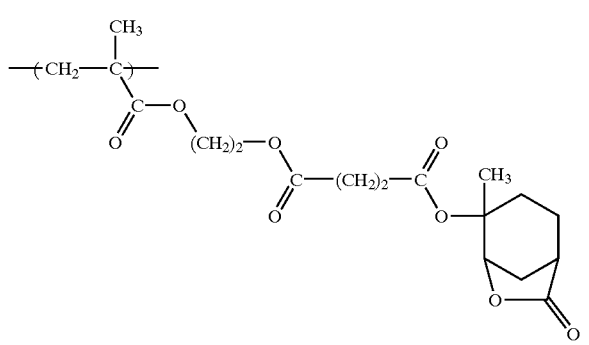

(Ib-40)

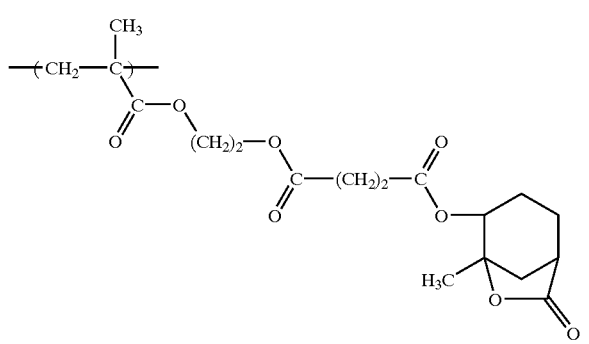

(Ib-41)

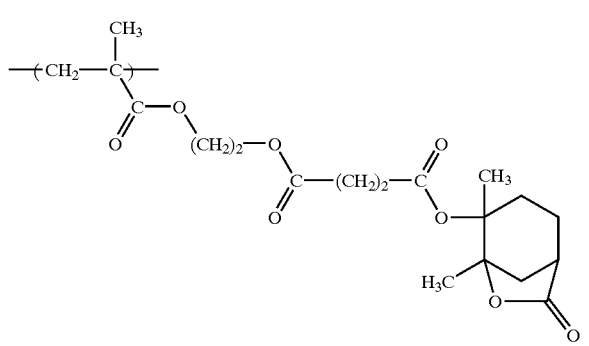

(Ib-42)

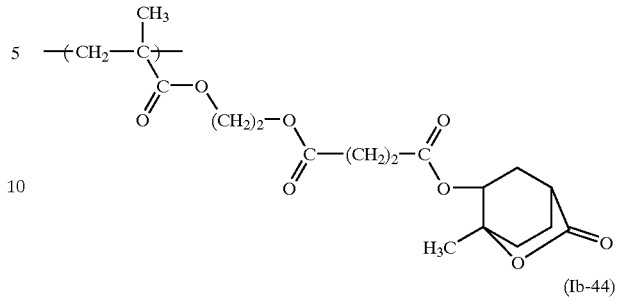

(Ib-43)

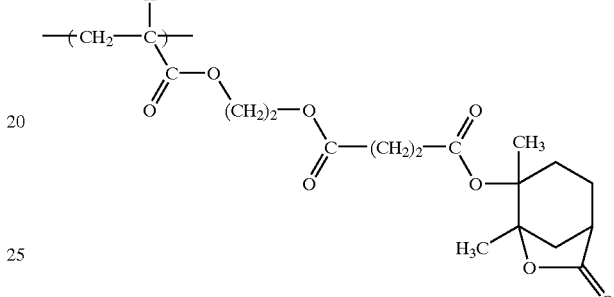

(Ib-44)

The repeating unit including adamantane lactone includes a repeating unit represented by the following formula (VI):

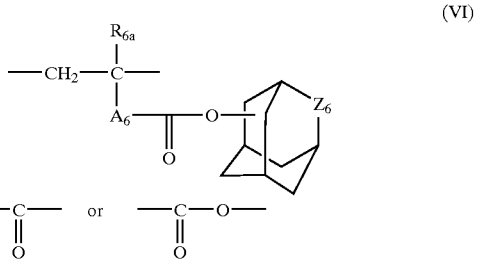

(VI)

$Z_6$: 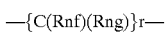

In formula (VI), $A_6$ represents a single bond, an alkylene group, a cycloalkylene group, an ether group, a thioether group, a carbonyl group, an ester group or a combination of two or more thereof.

$R_{6a}$ represents a hydrogen atom, an alkyl group having from 1 to 4 carbon atoms, a cyano group or a halogen atom.

The alkylene group represented by $A_6$ in formula (VI) includes a group represented by the following formula:

—{C(Rnf)(Rng)}r—

In the above formula, Rnf and Rng, which may be the same or different, each represent a hydrogen atom, an alkyl group, a substituted alkyl group, a halogen atom, a hydroxy group or an alkoxy group, and r represents an integer of from 1 to 10.

The alkyl group represented by Rnf or Rng is preferably a lower alkyl group, for example, methyl, ethyl, propyl, isopropyl or butyl group, more preferably methyl, ethyl, propyl or isopropyl group. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy or butoxy group. The halogen atom includes chlorine, bromine, fluorine and iodine atoms.

The cycloalkylene group represented by $A_6$ in formula (VI) includes a cycloalkylene group having from 3 to 10 carbon atoms, for example, cyclopentylene, cyclohexylene or cyclooctylene group.

In formula (VI), the bridged alicyclic group including $Z_6$ may have one or more substituents. Examples of the substituent include a halogen atom, an alkoxy group (preferably an alkoxy group having from 1 to 4 carbon atoms), an alkoxycarbonyl group (preferably an alkoxycarbonyl group having from 1 to 5 carbon atoms), an acyl group (for example, formyl or benzyl group), an acyloxy group (for example, propylcarbonyloxy or benzoyloxy group), an alkyl group (preferably an alkyl group having from 1 to 4 carbon atoms), a carboxy group, a hydroxy group and an alkylsulfonylcarbamoyl group (for example, —$CONHSO_2CH_3$). The alkyl group as the substituent may further be substituted with a hydroxy group, a halogen atom or an alkoxy group (preferably an alkoxy group having from 1 to 4 carbon atoms).

The oxygen atom of the ester group connected to $A_6$ in formula (VI) can be bonded to any one of the carbon atoms constituting the bridged alicyclic structure containing $Z_6$.

Specific examples of the repeating unit represented by formula (VI) are set forth below, but the present invention should not be construed as being limited thereto.

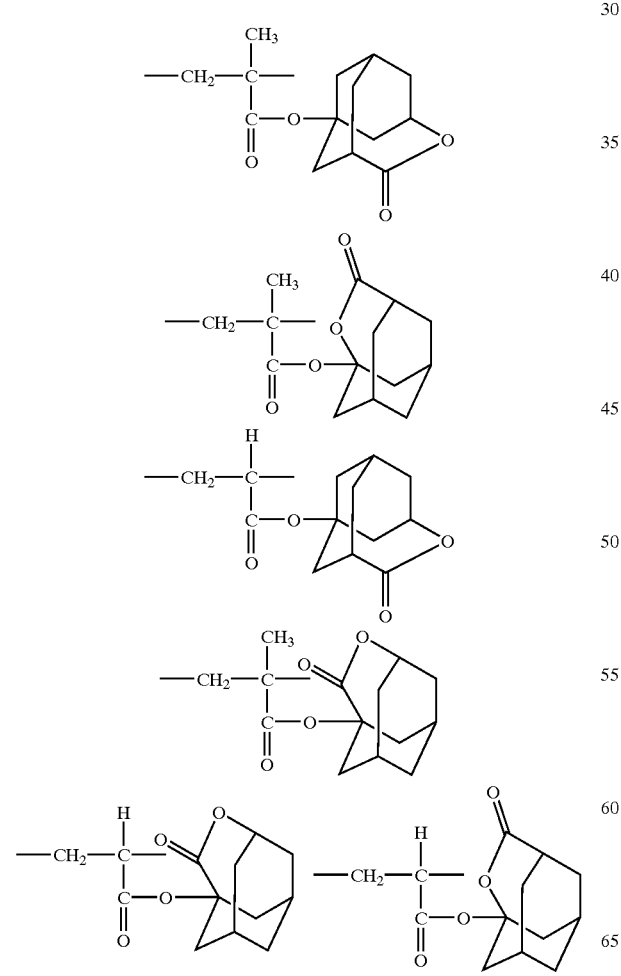

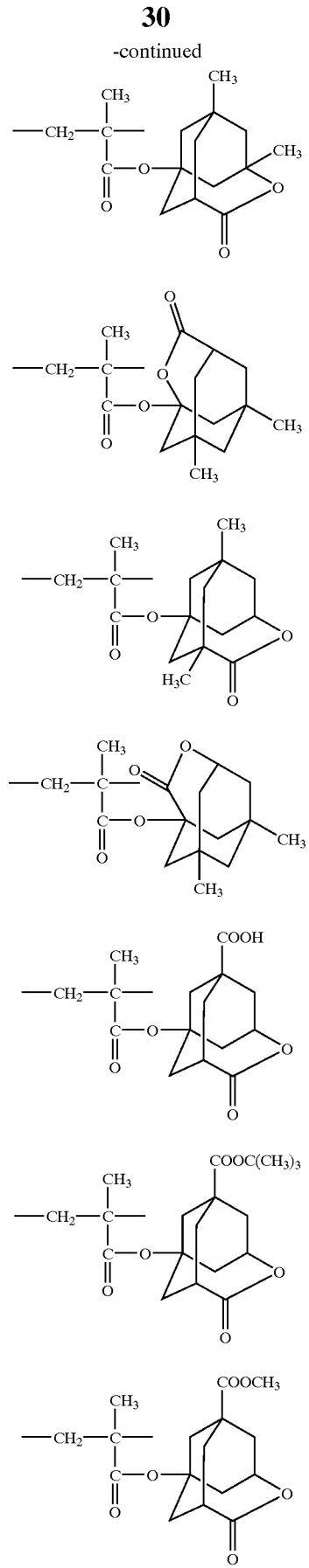

-continued

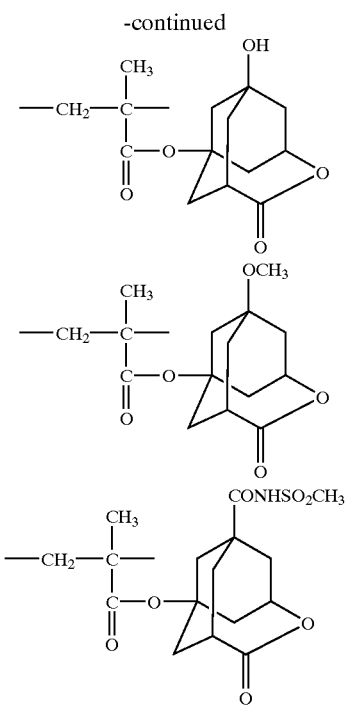

The acid-decomposable resin of component (A) according to the present invention may further contain a repeating unit including a lactone structure represented by the following formula (IV):

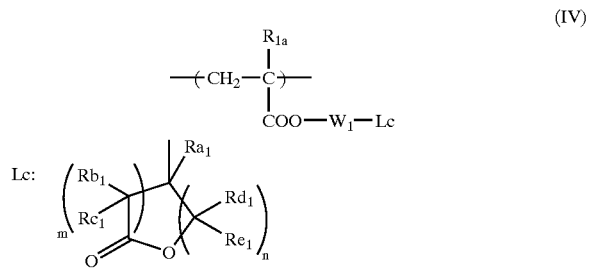

(IV)

In formula (IV), $R_{1a}$ represents a hydrogen atom or a methyl group.

$W_1$ represents a single bond, an alkylene group, an ether group, a thioether group, a carbonyl group, an ester group or a combination of two or more thereof.

$R_{a1}$, $R_{b1}$, $R_{c1}$, $R_{d1}$ and $R_{e1}$, which may be the same or different, each independently represent a hydrogen atom or an alkyl group having from 1 to 4 carbon atoms. m and n, which may be the same or different, each independently represent an integer of from 0 to 3, provided that the sum total of m and n is from 2 to 6.

The alkyl group having from 1 to 4 carbon atoms represented by $R_{a1}$, $R_{b1}$, $R_{c1}$, $R_{d1}$ or $R_{e1}$ includes, for example, methyl, ethyl, propyl, isopropyl, n-butyl, isobutyl, sec-butyl and tert-butyl groups.

The alkylene group represented by $W_1$ in formula (IV) includes a group represented by the following formula:

—{C(Rf)(Rg)}$r_1$—

In the above formula, Rf and Rg, which may be the same or different, each represent a hydrogen atom, an alkyl group, a substituted alkyl group, a halogen atom, a hydroxy group or an alkoxy group, and $r_1$ represents an integer of from 1 to 10.

The alkyl group represented by Rf or Rg is preferably a lower alkyl group, for example, methyl, ethyl, propyl, isopropyl or butyl group, more preferably methyl, ethyl, propyl or isopropyl group. A substituent for the substituted alkyl group includes, for example, a hydroxy group, a halogen atom and an alkoxy group.

The alkoxy group includes an alkoxy group having from 1 to 4 carbon atoms, for example, methoxy, ethoxy, propoxy or butoxy group.

The halogen atom includes chlorine, bromine, fluorine and iodine atoms.

Examples of further substituent for the alkyl group include a carboxy group, an acyloxy group, a cyano group, an alkyl group, a substituted alkyl group, a halogen atom, a hydroxy group, an alkoxy group, a substituted alkoxy group, an acetylamido group, an alkoxycarbonyl group and an acyl group.

The alkyl group includes a lower alkyl group, for example, methyl, ethyl, propyl, isopropyl, butyl, cyclopropyl, cyclobutyl or cyclopentyl group. A substituent for the substituted alkyl group includes, for example, a hydroxy group, a halogen atom and an alkoxy group. A substituent for the substituted alkoxy group includes, for example, an alkoxy group. The alkoxy group includes an alkoxy group having from 1 to 4 carbon atoms, for example, methoxy, ethoxy, propoxy or butoxy group. The acyloxy group includes an acetoxy group. The halogen atom includes chlorine, bromine, fluorine and iodine atoms.

Specific examples of the repeating unit represented by formula (IV) are set forth below, but the present invention should not be construed as being limited thereto.

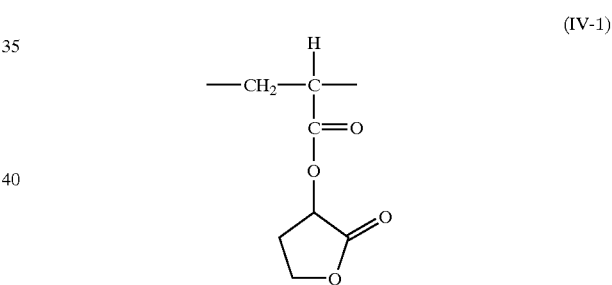

(IV-1)

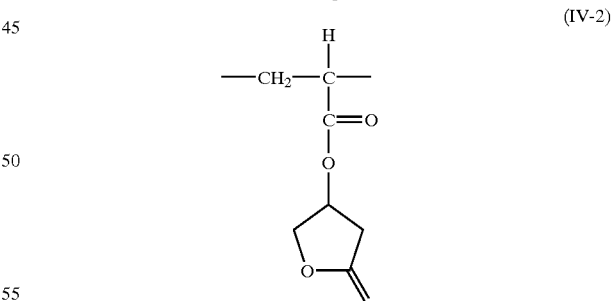

(IV-2)

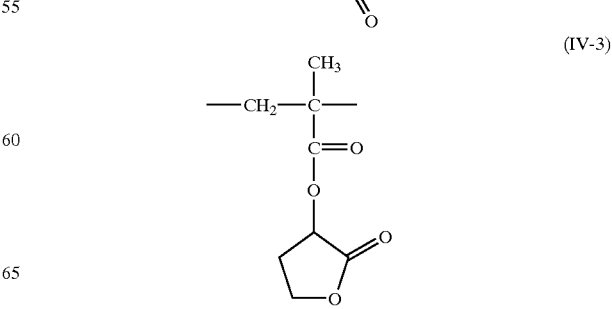

(IV-3)

(IV-4)
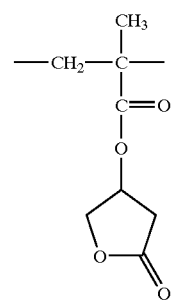
(IV-5)
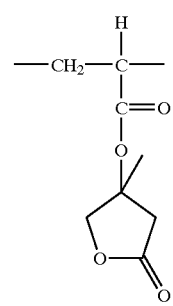
(IV-6)
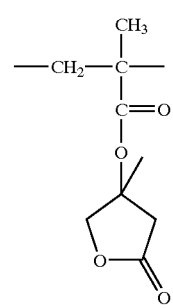
(IV-7)
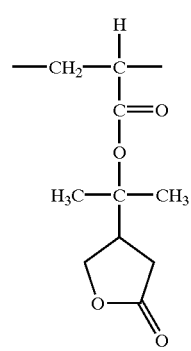
(IV-8)
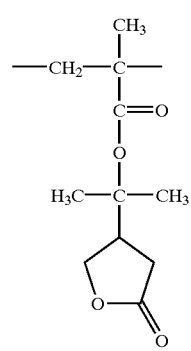
(IV-9)
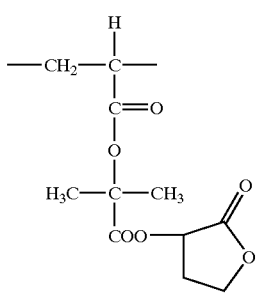
(IV-10)
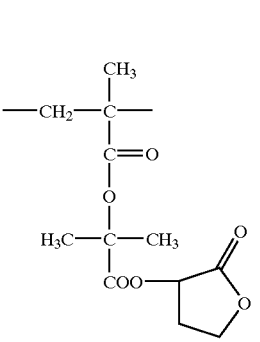
(IV-11)
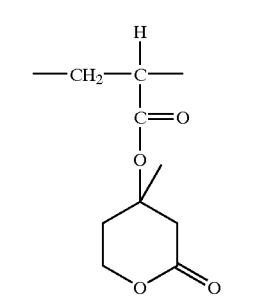
(IV-12)
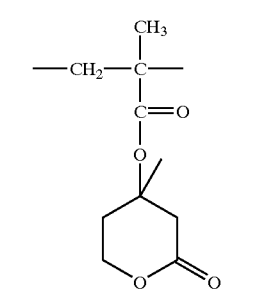
(IV-13)
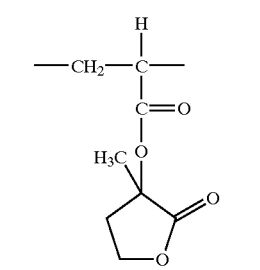

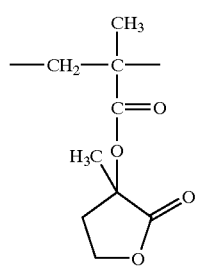 (IV-14)
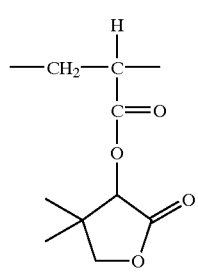 (IV-15)
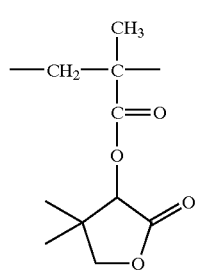 (IV-16)
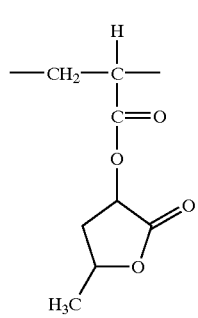 (IV-17)
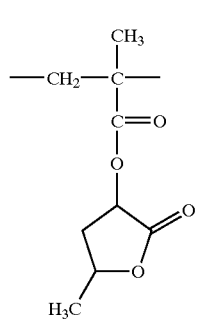 (IV-18)
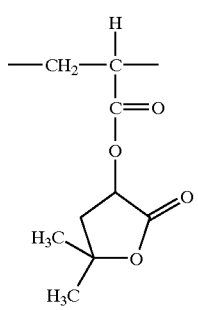 (IV-19)
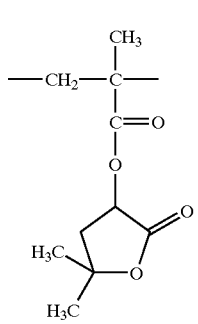 (IV-20)
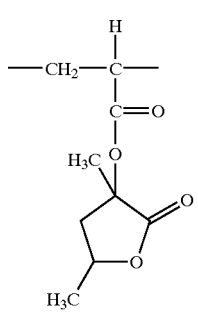 (IV-21)
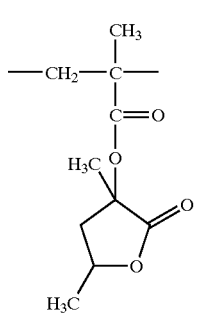 (IV-22)
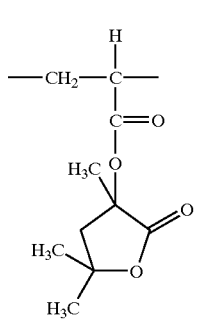 (IV-23)

-continued
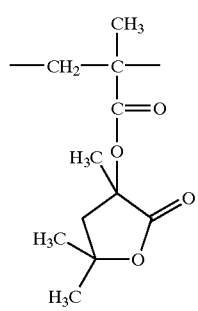
(IV-24)
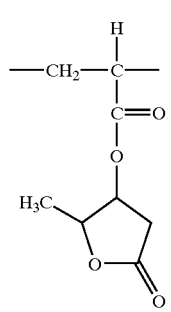
(IV-25)
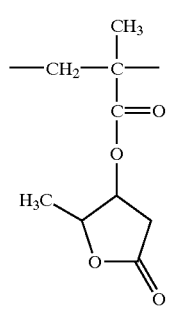
(IV-26)
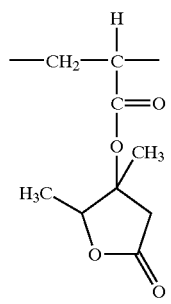
(IV-27)
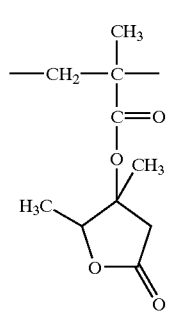
(IV-28)
-continued
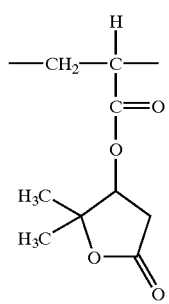
(IV-29)
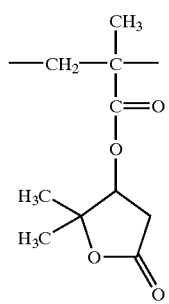
(IV-30)
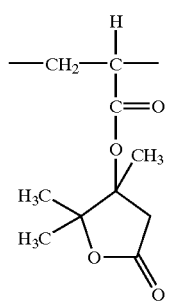
(IV-31)
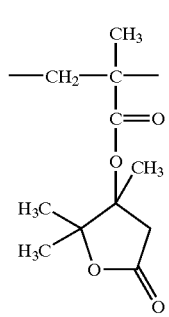
(IV-32)
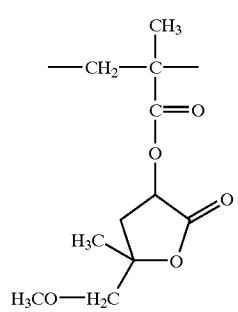
(IV-33)

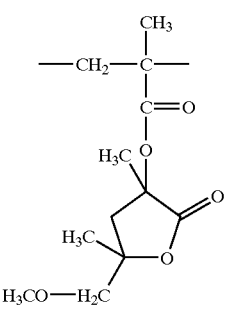

(IV-34)

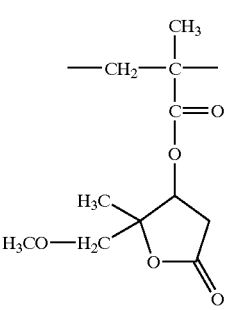

(IV-35)

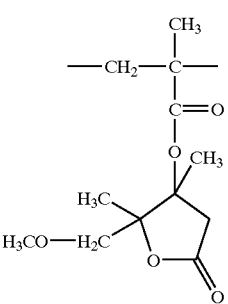

(IV-36)

Of the specific examples of the repeating unit represented by formula (VI), Repeating Units (IV-17) to (IV-36) are preferred in view of more improved exposure margin and wettability of a developing solution.

The acid-decomposable resin of component (A) according to the present invention may contain various repeating units in addition to the repeating units described above for the purposes of adjusting dry etching resistance, standard developing solution aptitude, adhesion to a substrate, resist profile, and other characteristics ordinarily required for resist, for example, resolution, heat resistance and sensitivity.

Examples of such repeating units include repeating units corresponding to monomers described below, but the present invention should not be construed as being limited thereto.

The introduction of additional repeating unit makes possible the minute control of characteristics required for the acid-decomposable resin, particularly (1) solubility in a coating solvent, (2) film forming property (glass transition temperature), (3) developing property with alkali, (4) reduction in a film thickness (hydrophobicity, selection of alkali-soluble group), (5) adhesion of the unexposed area to a substrate, and (6) dry etching resistance.

Examples of such monomers include compounds having one addition-polymerizable unsaturated bond, for example, an acrylate, a methacrylate, an acrylamide, a methacrylamide, an allyl compound, a vinyl ether and a vinyl ester.

Specific examples of the monomer include an acrylate, for example, an alkyl acrylate (preferably an alkyl acrylate containing an alkyl group having from 1 to 10 carbon atoms), e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxy-benzyl acrylate, furfuryl acrylate or tetrahydrofurfuryl acrylate; a methacrylate, for example, an alkyl methacrylate (preferably an alkyl methacrylate containing an alkyl group having form 1 to 10 carbon atoms), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate or tetrahydrofurfuryl methacrylate; an acrylamide, for example, acrylamide, an N-alkylacrylamide (the alkyl group of which is an alkyl group having from 1 to 10 carbon atoms, e.g., methyl, ethyl, propyl, butyl, tert-butyl, heptyl, octyl, cyclohexyl or hydroxyethyl group), an N,N-dialkylacrylamide (the alkyl group of which is an alkyl group having form 1 to 10 carbon atoms, e.g., methyl, ethyl, butyl, isobutyl, ethylhexyl or cyclohexyl group), N-hydroxyethyl-N-methylacrylamide and N-2-acetamidoethyl-N-acetylacrylamide; a methacrylamide, for example, methacrylamide, an N-alkylmethacrylamide (the alkyl group of which is an alkyl group having from 1 to 10 carbon atoms, e.g., methyl, ethyl, tert-butyl, ethylhexyl, hydroxyethyl or cyclohexyl group), an N,N-dialkylmethacrylamide (the alkyl group of which includes, e.g., ethyl, propyl and butyl groups) and N-hydroxyethyl-N-methylmethacrylamide; an allyl compound, for example, an allyl ester (e.g., allyl acetate, allyl caproate, ally caprate, allyl laurate, allyl palmitate, allyl stearate, allyl benzoate, allyl acetoacetate or ally lactate) and allyl oxyethanol; a vinyl ether, for example, an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether or tetrahydrofurfuryl vinyl ether) ; a vinyl ester, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate or vinyl cyclohexylcarboxylate; a dialkyl itaconate, for example, dimethyl itaconate, diethyl itaconate or dibutyl itaconate; a monoalkyl or dialkyl fumarate, for example, dibutyl fumalate; crotonic acid, itaconic acid, maleic anhydride, maleimide, acrylonitrile, methacrylonitrile and maleonitrile.

In addition, any addition-polymerizable unsaturated compound copolymerizable with monomers corresponding to the repeating units described above may be employed.

A molar ratio of each repeating unit in the acid-decomposable resin can be appropriately determined taking the adjustment of many factors including dry etching resistance of resist, standard developing solution aptitude, adhesion to a substrate, resist profile, and other characteristics ordinarily required for resist, for example, resolution, heat resistance and sensitivity into consideration.

In the acid-decomposable resin of component (A), a content of the repeating unit represented by formula (I) is preferably from 15 to 60% by mole, more preferably from 18 to 55% by mole, and still more preferably from 20 to 50% by mole, based on the total repeating units of the acid-decomposable resin.

A content of the repeating unit represented by formula (II) is preferably from 5 to 50% by mole, more preferably from 8 to 40% by mole, and still more preferably from 10 to 30% by mole, based on the total repeating units of the acid-decomposable resin.

The sum total of the contents of the repeating unit represented by formula (I) and the repeating unit represented by formula (II) is preferably from 25 to 90% by mole, more preferably from 30 to 80% by mole, and still more preferably from 35 to 70% by mole, based on the total repeating units of the acid-decomposable resin.

A molar ratio of the repeating unit represented by formula (I) to the repeating unit represented by formula (II) is ordinarily from 4:1 to 1:2, and preferably from 3:1 to 2:3. It is advantageous in view of the production cost to increase the content of the repeating unit represented by formula (II).

A content of the repeating unit represented by formula (III) is preferably from 5 to 50% by mole, more preferably from 10 to 45% by mole, and still more preferably from 15 to 40% by mole, based on the total repeating units of the acid-decomposable resin.

A content of the repeating unit including an alicyclic lactone structure is preferably from 5 to 60% by mole, more preferably from 10 to 55% by mole, and still more preferably from 15 to 50% by mole, based on the total repeating units of the acid-decomposable resin.

A content of the repeating unit having a lactone structure in its side chain represented by formula (IV) is preferably from 5 to 60% by mole, more preferably from 10 to 50% by mole, and still more preferably from 15 to 45% by mole, based on the total repeating units of the acid-decomposable resin.

When the resist composition of the present invention is used for ArF exposure, it is preferred that the acid-decomposable resin does not contain an aromatic group in order to ensure transparency of the ArF beam.

The acid-decomposable resin for use in the present invention can be synthesized according to conventional methods, for example, radical polymerization. For instance, in ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent dissolving the monomers, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction mixture is poured into a solvent to correct powder or solid, thereby obtaining the desired polymer. The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

A weight average molecular weight of the acid-decomposable resin of component (A) for use in the present invention is preferably form 3,000 to 100,000, more preferably form 4,000 to 50,000, and still more preferably form 5,000 to 30,000, measured by a GPC method and calculated in terms of polystyrene. It is not preferred that the weight average molecular weight of the resin is less than 3,000, since the degradation of heat resistance and dry etching resistance may occur. On the other hand, when the weight average molecular weight of the resin is more than 100,000, undesirable results, for example, the degradation of developing property and film-forming property due to severe increase in viscosity may occur.

A dispersity (Mw/Mn) of the acid-decomposable resin of component (A) according to the present invention is preferably in a range of from 1.3 to 4.0, more preferably from 1.4 to 3.8, and still more preferably from 1.5 to 3.5.

A content of the acid-decomposable resin of component (A) in the positive resist composition of the present invention is preferably from 40 to 99.99% by weight, and more preferably from 50 to 99.97% by weight, based on the total solid content of the resist composition.

[2] (B) Compound that Generates an Acid upon Irradiation of an Actinic Ray or Radiation (Hereinafter, also Referred to as an "Photo-acid Generator")

The photo-acid generator of component (B) for use in the present invention is a compound that generates an acid upon irradiation of an actinic ray or radiation.

The photo-acid generator for use in the present invention can be appropriately selected from photoinitiators for photo-cationic polymerization, photoinitiators for photo-radical polymerization, photo-achromatic agents for dyes, photo-discoloring agents, compounds generating an acid upon irradiation of known light used for a microresist (an ultra-violet ray or far ultraviolet ray of from 400 to 200 nm, particularly preferably, a g-line, h-line, i-line or KrF excimer laser beam), an ArF excimer laser beam, an electron beam, an X ray, a molecular beam or an ion beam, and a mixture thereof.

Examples of such photo-acid generators include an onium salt, for example, a diazonium salt, an ammonium salt, a phosphonium salt, an iodonium salt, a sulfonium salt, a selenonium salt or an arsonium salt, an organic halogeno compound, an organo-metal/organic halide compound, a photo-acid generator having an o-nitrobenzyl type protective group, a compound generating a sulfonic acid upon photolysis, which is represented by an iminosulfonate, a disulfone compound, a diazoketosulfone compound and a diazodisulfone compound.

Also, polymer compounds in which a group or compound generating an acid upon irradiation of an actinic ray or radiation is introduced into the main chain or side chain thereof may be used.

Further, compounds generating an acid with light as described, for example, in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 may be used.

Of the compounds decomposing upon irradiation of an actinic ray or radiation to generate an acid, those which can be particularly effectively used are described below.

(1) Oxazole derivative substituted with trihalomethyl group represented by formula (PAG1) shown below or S-triazine derivative substituted with trihalomethyl group represented by formula (PAG2) shown below:

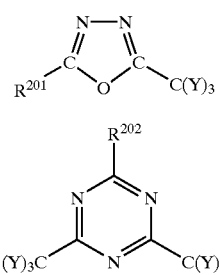
(PAG1)

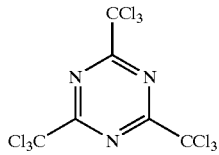
(PAG2)

In formulae (PAG1) and (PAG2), $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group or —C(Y)$_3$; and Y represents a chlorine atom or a bromine atom.

Specific examples of such compounds are set forth below, but the present invention should not be construed as being limited thereto.

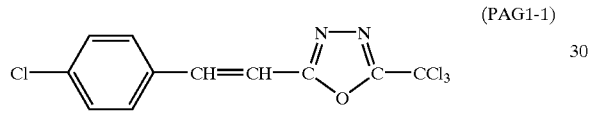
(PAG1-1)

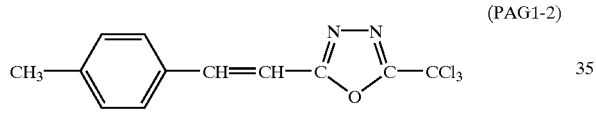
(PAG1-2)

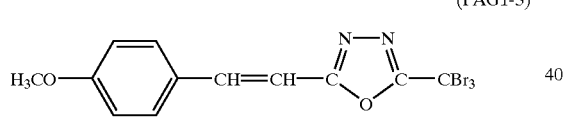
(PAG1-3)

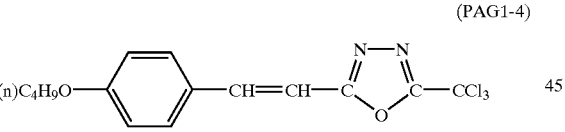
(PAG1-4)

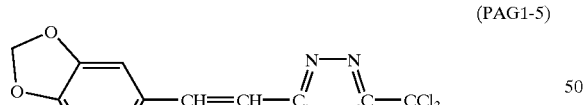
(PAG1-5)

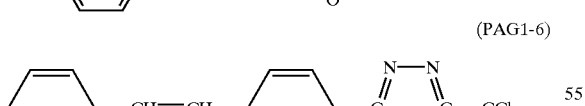
(PAG1-6)

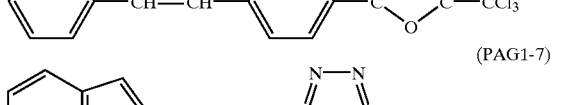
(PAG1-7)

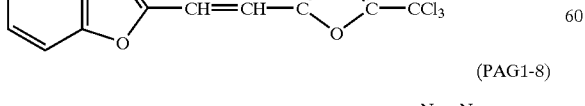
(PAG1-8)

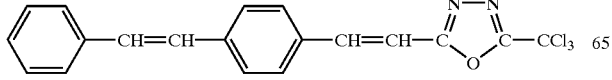

-continued

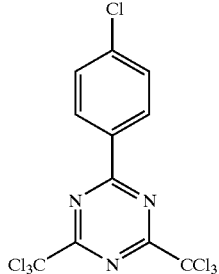
(PAG2-1)

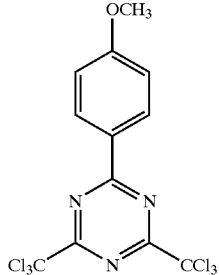
(PAG2-2)

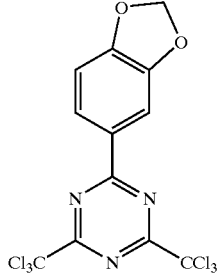
(PAG2-3)

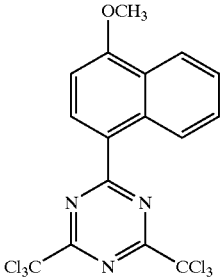
(PAG2-4)

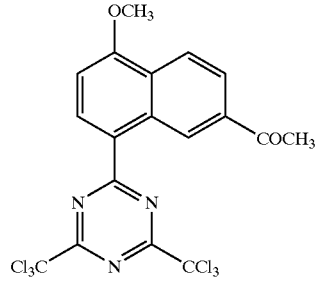
(PAG2-5)

(PAG2-6)

-continued (PAG2-7)
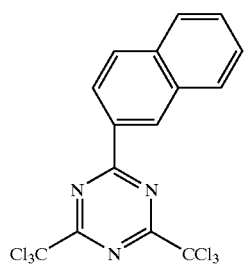

(PAG2-8)
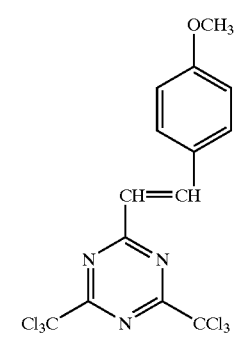

(PAG2-9)
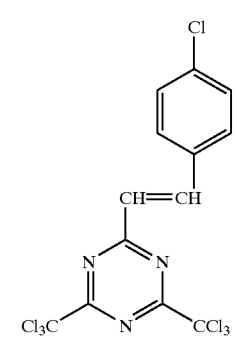

(PAG2-10)
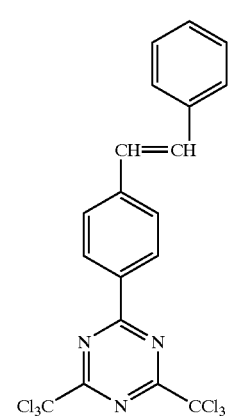

(2) Iodonium salt represented by formula (PAG3) shown below or sulfonium salt represented by formula (PAG4) shown below:

(PAG3)

-continued (PAG4)
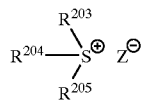

In formulae (PAG3) and (PAG4), $Ar^1$ and $Ar^2$, which may be the same or different, each independently represent a substituted or unsubstituted aryl group.

$R^{203}$, $R^{204}$ and $R^{205}$, which may be the same or different, each independently represents a substituted or unsubstituted alkyl group or a substituted or unsubstituted aryl group.

$Z^-$ represents a counter anion. Examples of the counter anion include $BF_4^-$, $AsF_6^-$, $PF_6^-$, $SbF_6^-$, $SiF_6^{2-}$, $ClO_4^-$, a perfluoroalkane sulfonic acid anion, e.g., $CF_3SO_3^-$, pentafluorobenzene sulfonic acid anion, a condensed polynuclear aromatic sulfonic anion, e.g., naphthalene-1-sulfonic acid anion, an anthraquinone sulfonic acid anion and a dye containing a sulfonic acid group, however, the present invention should not be construed as being limited thereto.

Two of $R^{203}$, $R^{204}$ and $R^{205}$ or $Ar^1$ and $Ar^2$ may be combined with each other through a single bond or a substituent.

Specific examples of such compounds are set forth below, but the present invention should not be construed as being limited thereto.

(PAG3-1)
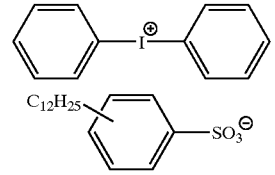

(PAG3-2)
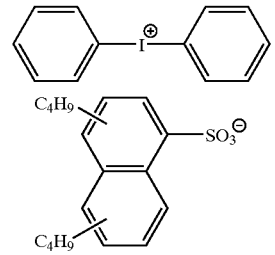

(PAG3-3)
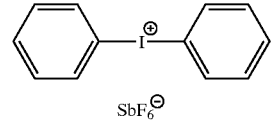

(PAG3-4)
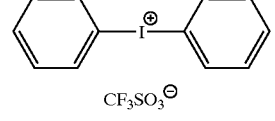

(PAG3-5)
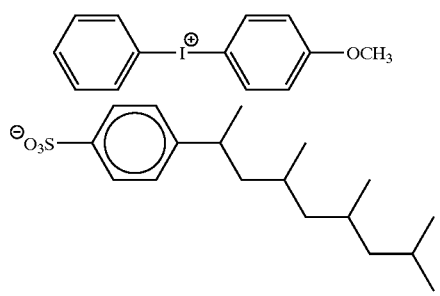
(PAG3-6)
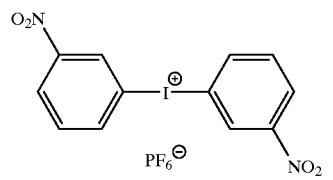
(PAG3-7)
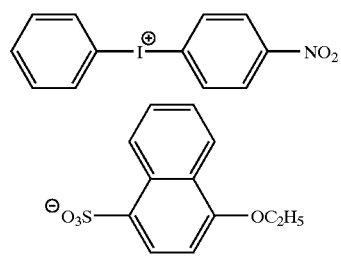
(PAG3-8)
(PAG3-9)
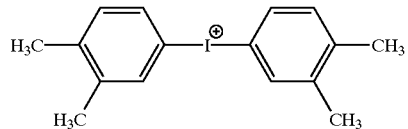
(PAG3-10)
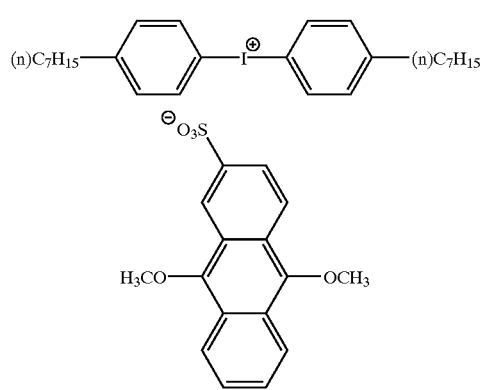
(PAG3-11)
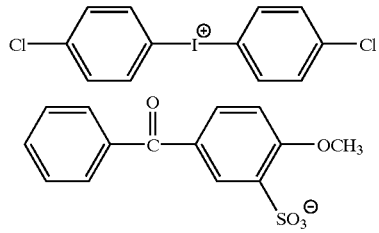
(PAG3-12)
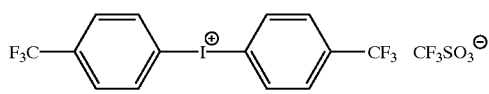
(PAG3-13)
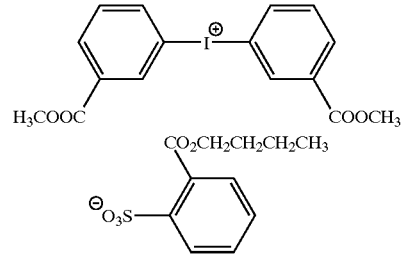
(PAG3-14)
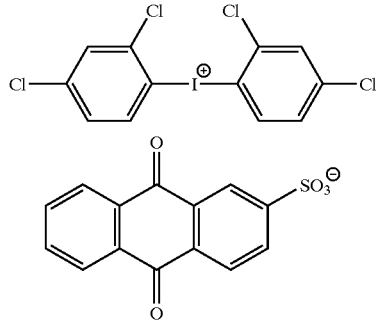
(PAG3-15)
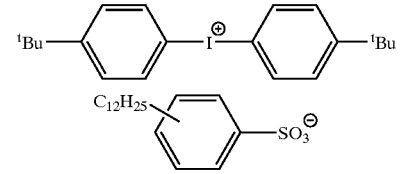
(PAG3-16)
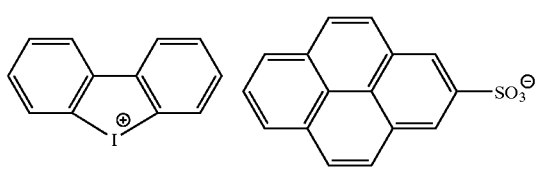
(PAG3-17)
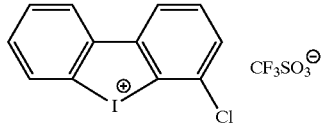

(PAG3-18)
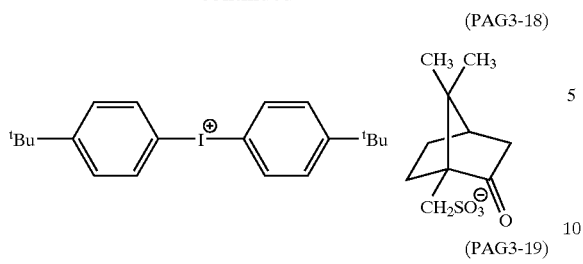
(PAG3-19)
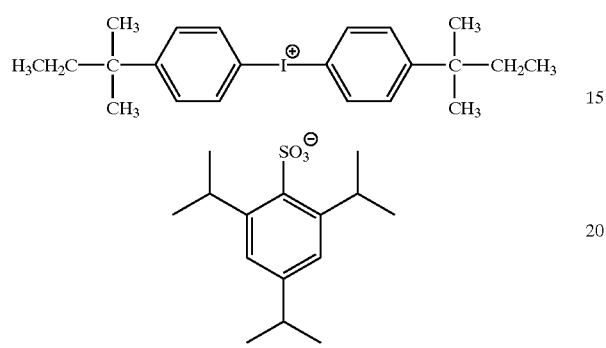
(PAG3-20)
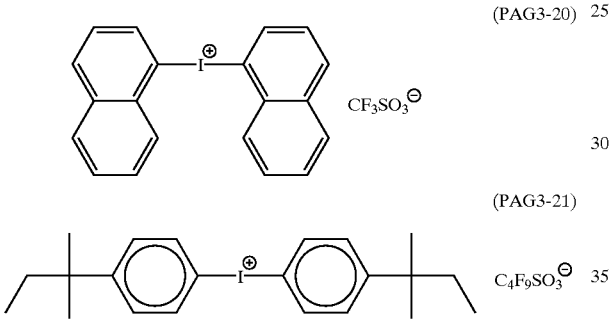
(PAG3-21)
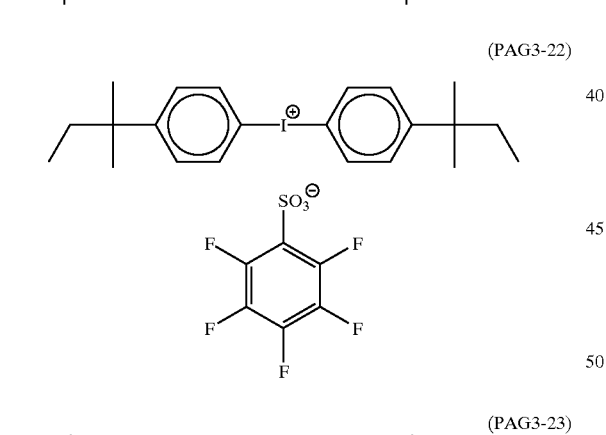
(PAG3-22)
(PAG3-23)
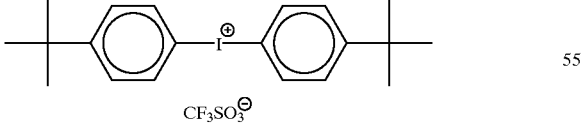
(PAG3-24)
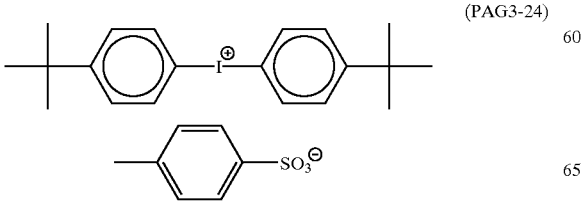
(PAG3-25)
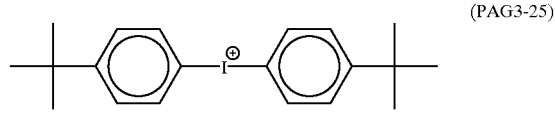
(PAG4-1)
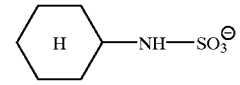
(PAG4-2)
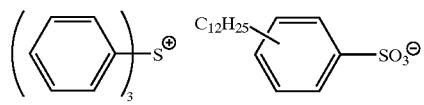
(PAG4-3)
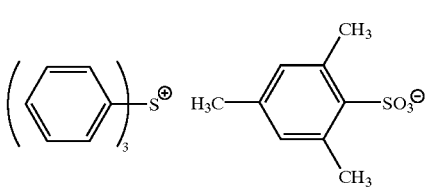
(PAG4-4)
(PAG4-5)
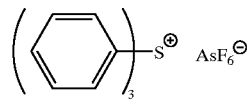
(PAG4-6)
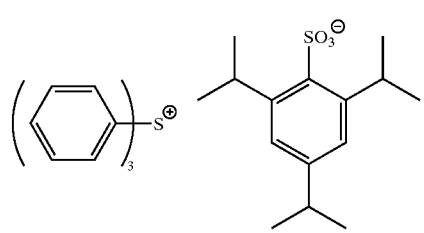
(PAG4-7)
(PAG4-8)
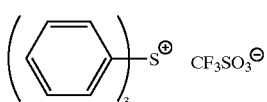
(PAG4-9)
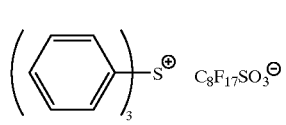

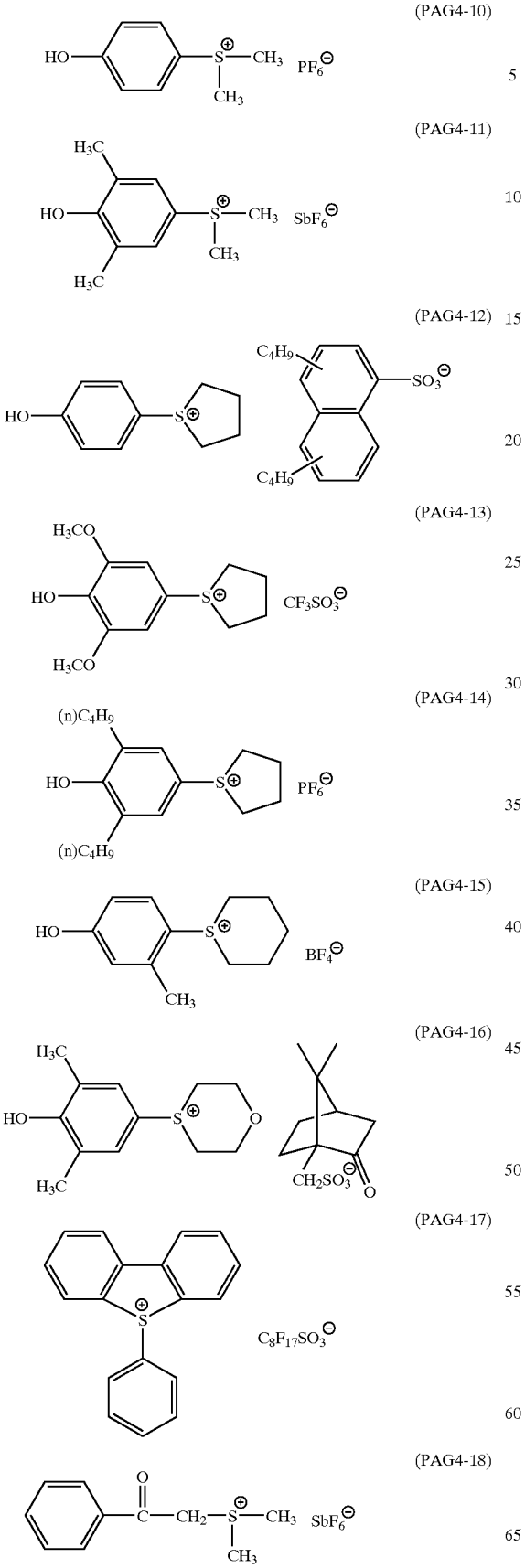

(PAG4-27)
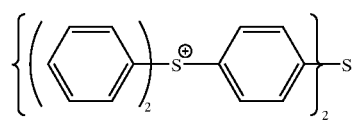
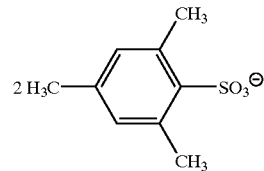
(PAG4-28)
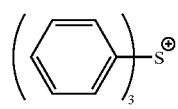
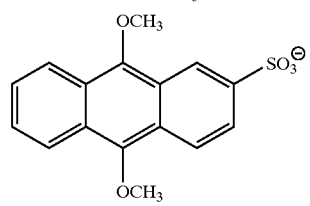
(PAG4-29)
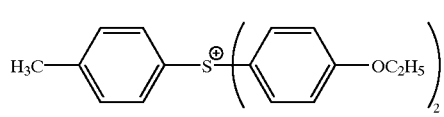
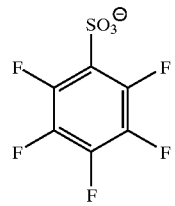
(PAG4-30)
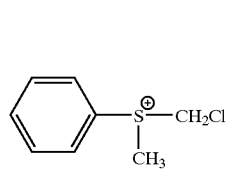
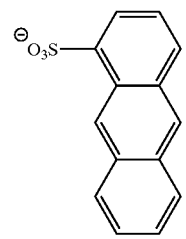
(PAG4-31)
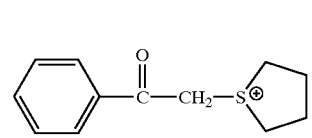 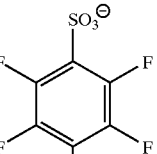
(PAG4-32)
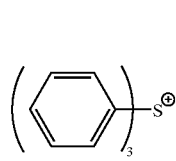
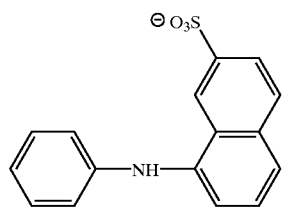
(PAG4-33)
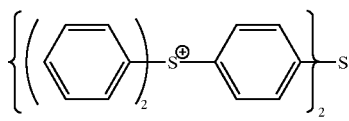
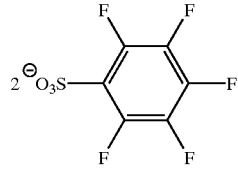
(PAG4-34)
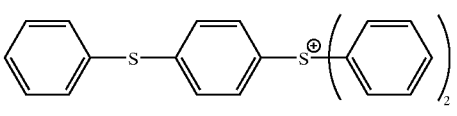
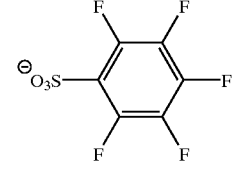
(PAG4-35)
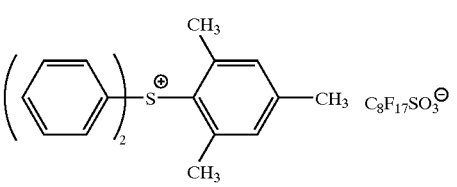
(PAG4-36)
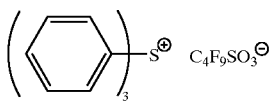
(PAG4-37)
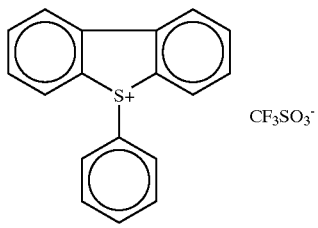
(PAG4-38)
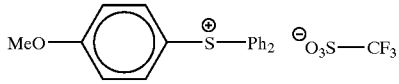
(PAG4-39)
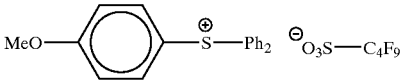
(PAG4-40)
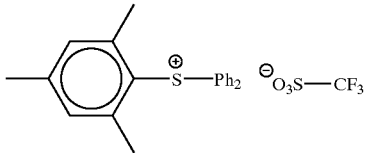
(PAG4-41)
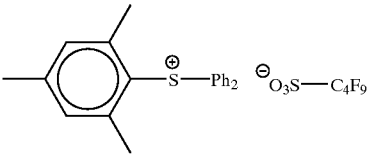

(PAG4-42)
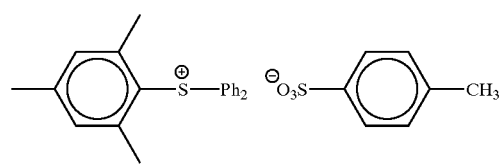
(PAG4-43)
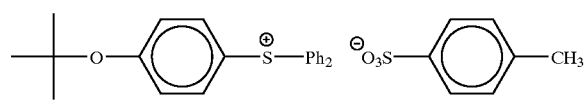
(PAG4-44)
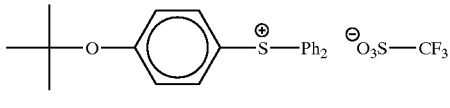
(PAG4-45)
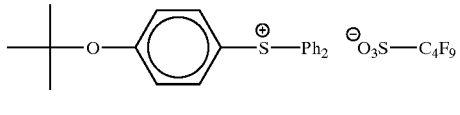
(PAG4-46)
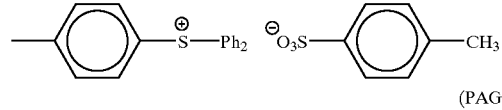
(PAG4-47)
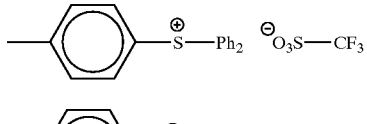
(PAG4-48)
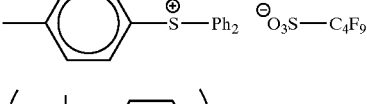
(PAG4-49)
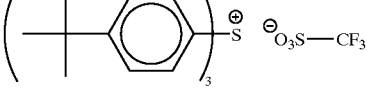
(PAG4-50)
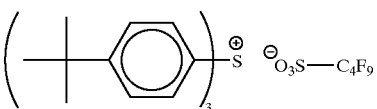
(PAG4-51)
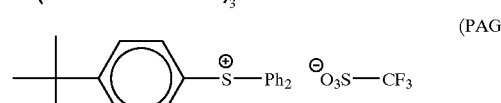
(PAG4-52)
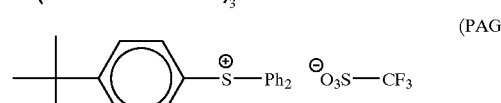
(PAG4-53)
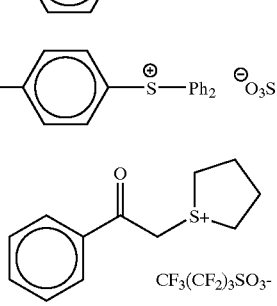
(PAG4-54)
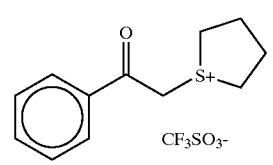
(PAG4-55)
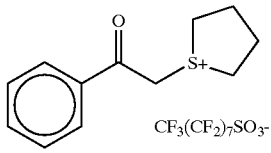
(PAG4-56)
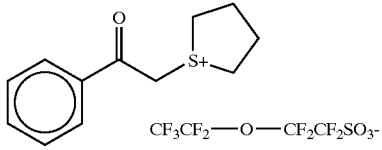
(PAG4-57)
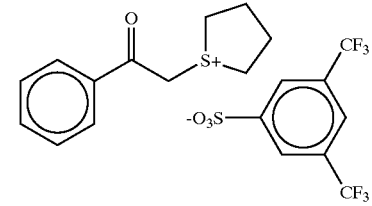
(PAG4-58)
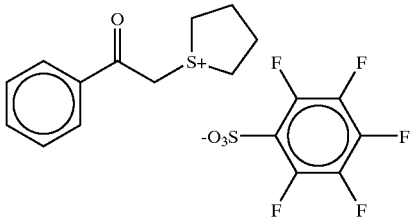
(PAG4-59)
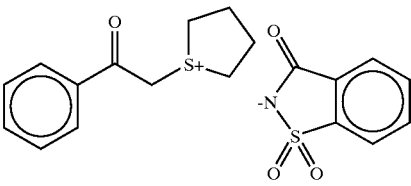
(PAG4-60)
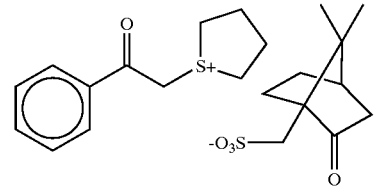
(PAG4-61)
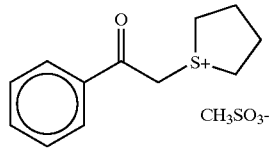
(PAG4-62)
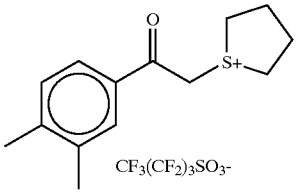

-continued
(PAG4-63)
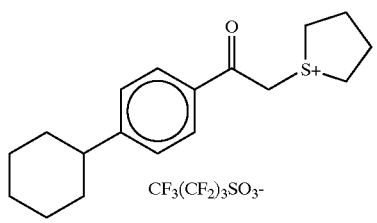
(PAG4-64)
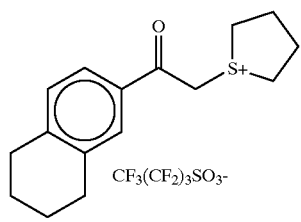
(PAG4-65)
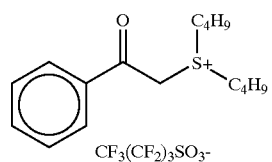
(PAG4-66)
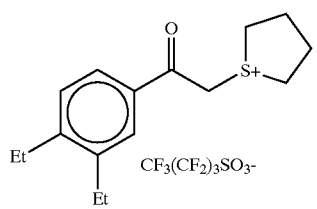
(PAG4-67)
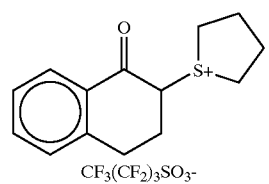
(PAG4-68)
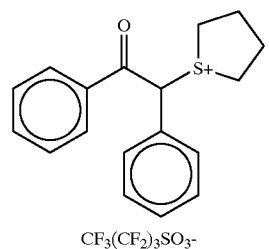
(PAG4-69)
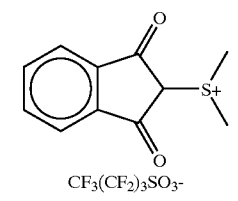
-continued
(PAG4-70)
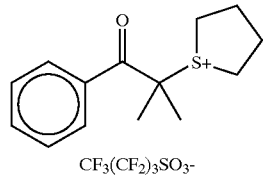
(PAG4-71)
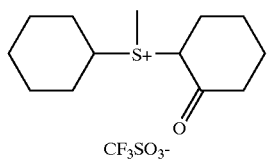
(PAG4-72)
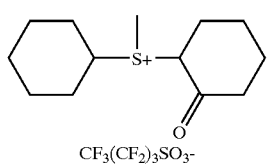
(PAG4-73)
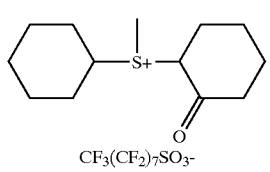
(PAG4-74)
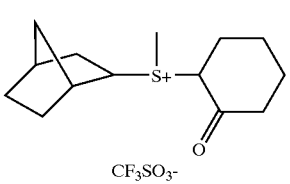
(PAG4-75)
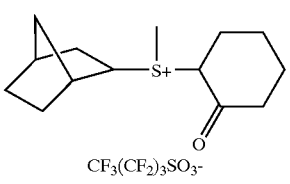
(PAG4-76)
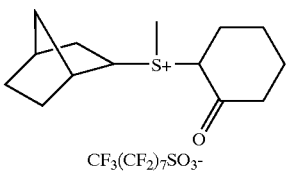
(PAG4-77)
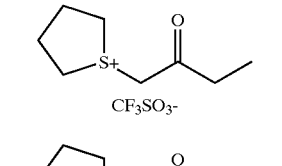
(PAG4-78)
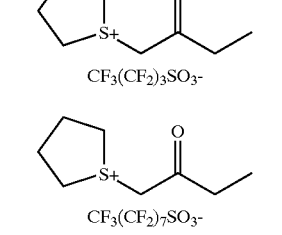
(PAG4-79)
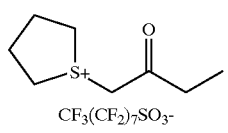

(PAG4-80)
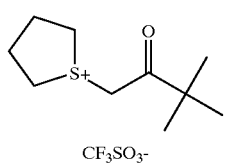
(PAG4-81)
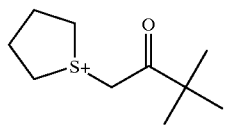
(PAG4-82)
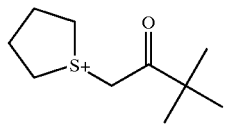
(PAG4-83)
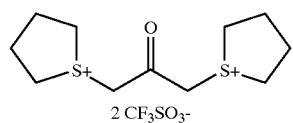
(PAG4-84)
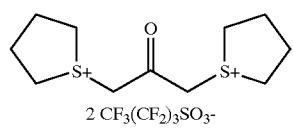
(PAG4-85)
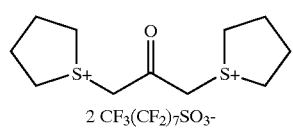
(PAG4-86)
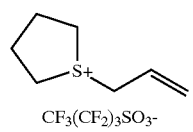
(PAG4-87)
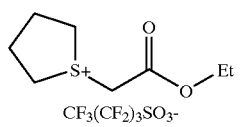
(PAG4-88)
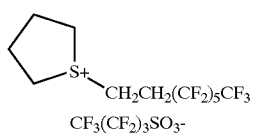
(PAG4-89)
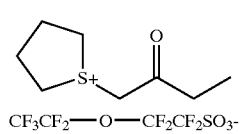
(PAG4-90)
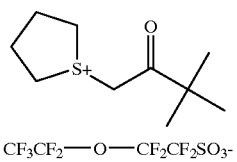
(PAG4-91)
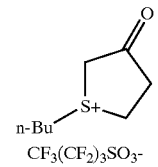
(PAG4-92)
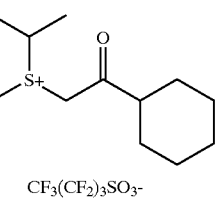
(PAG4-93)
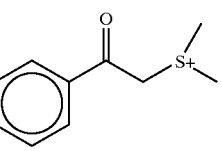
(PAG4-94)
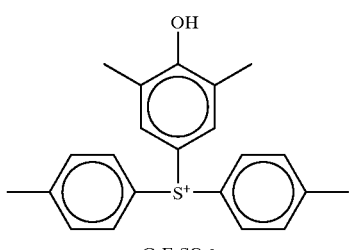
(PAG4-95)
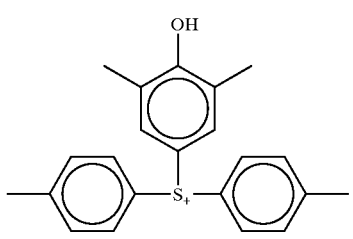
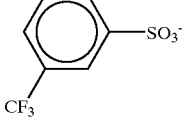

(PAG4-96)

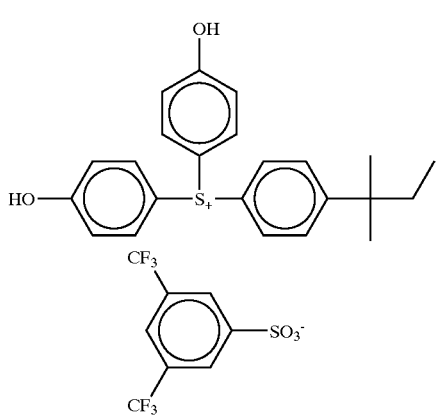

In the formulae described above, Ph represents a phenyl group.

The onium salts represented by formulae (PAG3) and (PAG4) are known and can be synthesized by methods described, for example, in U.S. Pat. Nos. 2,807,648 and 4,247,473 and JP-A-53-101331.

(3) Disulfone derivative represented by formula (PAG5) shown below or iminosulfonate derivative represented by formula (PAG6) shown below:

(PAG5)

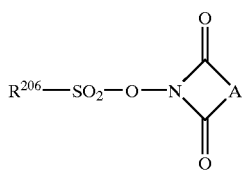
(PAG6)

In formulae (PAG5) and (PAG6), $Ar^3$ and $Ar^4$, which may be the same or different, each independently represent a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Specific examples of such compounds are set forth below, but the present invention should not be construed as being limited thereto.

(PAG5-1)
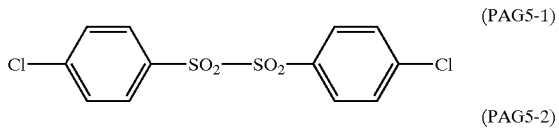

(PAG5-2)
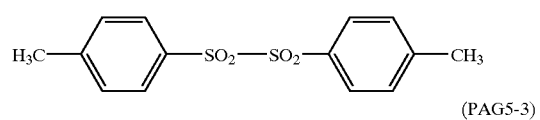

(PAG5-3)
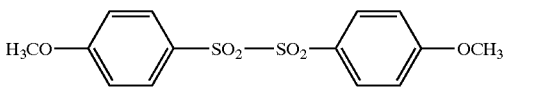

(PAG5-4)
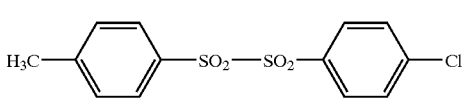

(PAG5-5)

(PAG5-6)
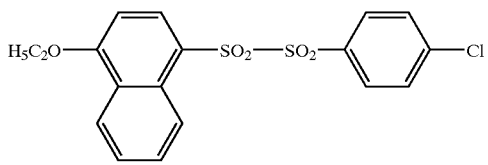

(PAG5-7)
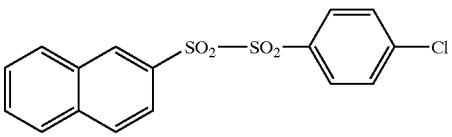

(PAG5-8)
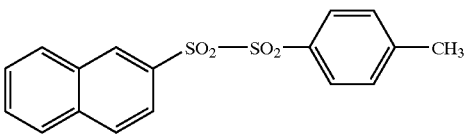

(PAG5-9)

(PAG5-10)
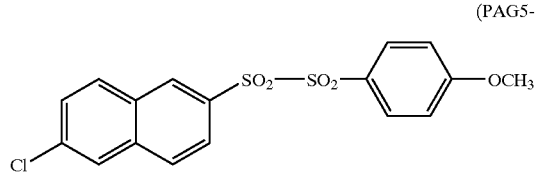

(PAG5-11)
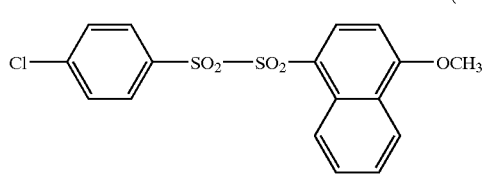

(PAG5-12)

(PAG5-13)
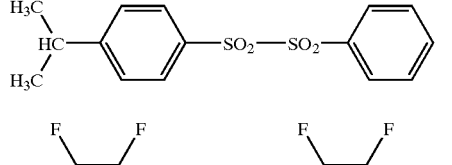

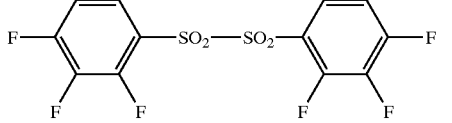

(PAG5-14)
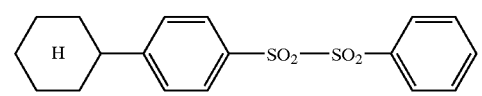
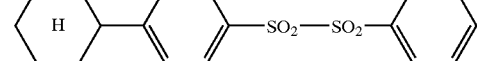

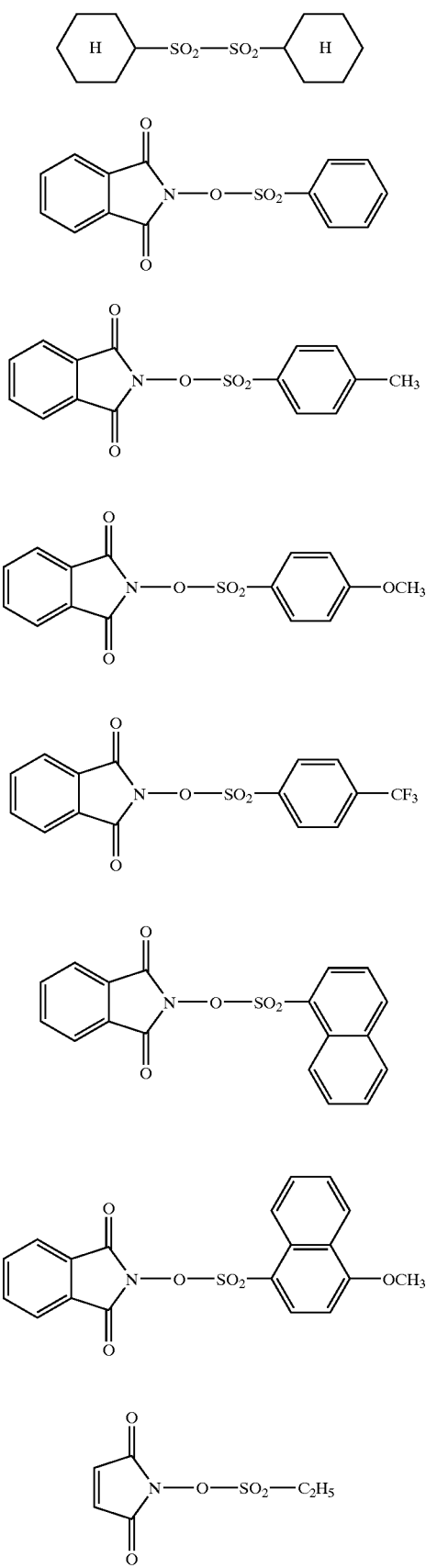
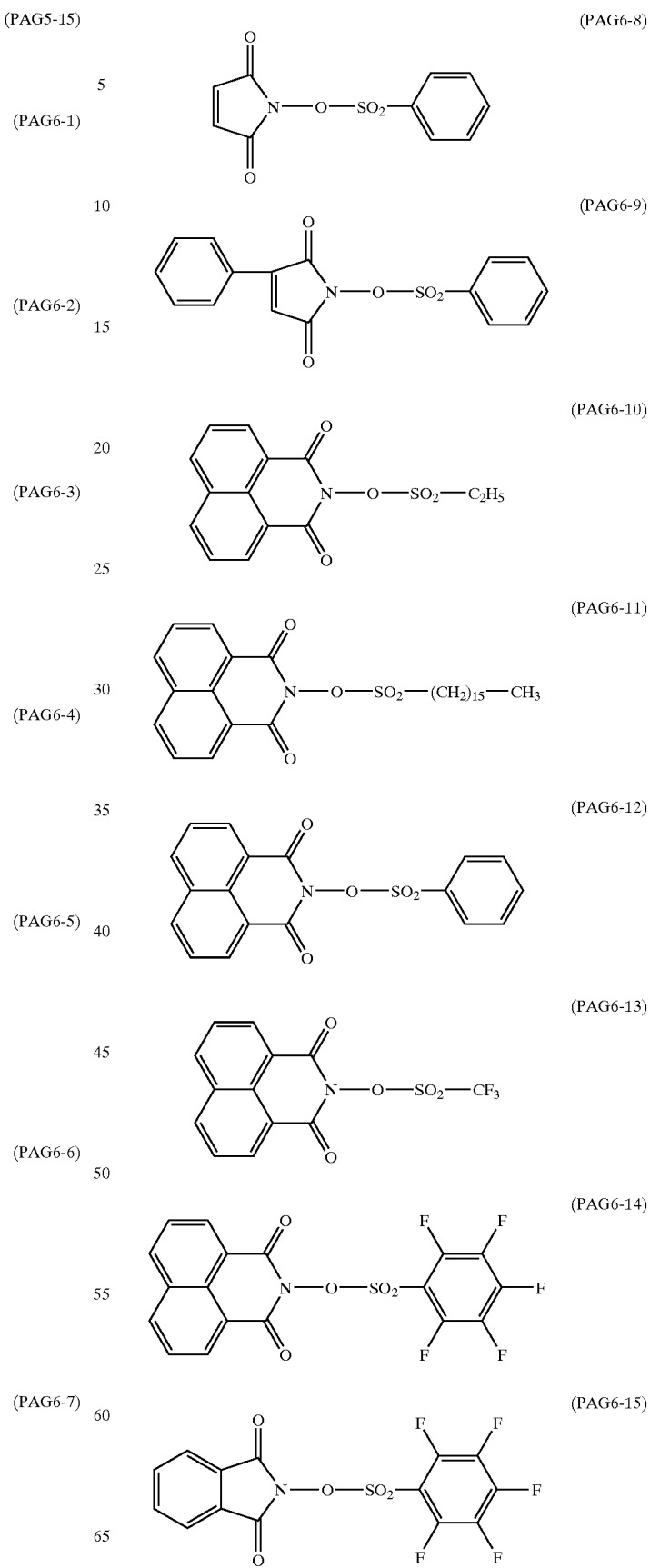

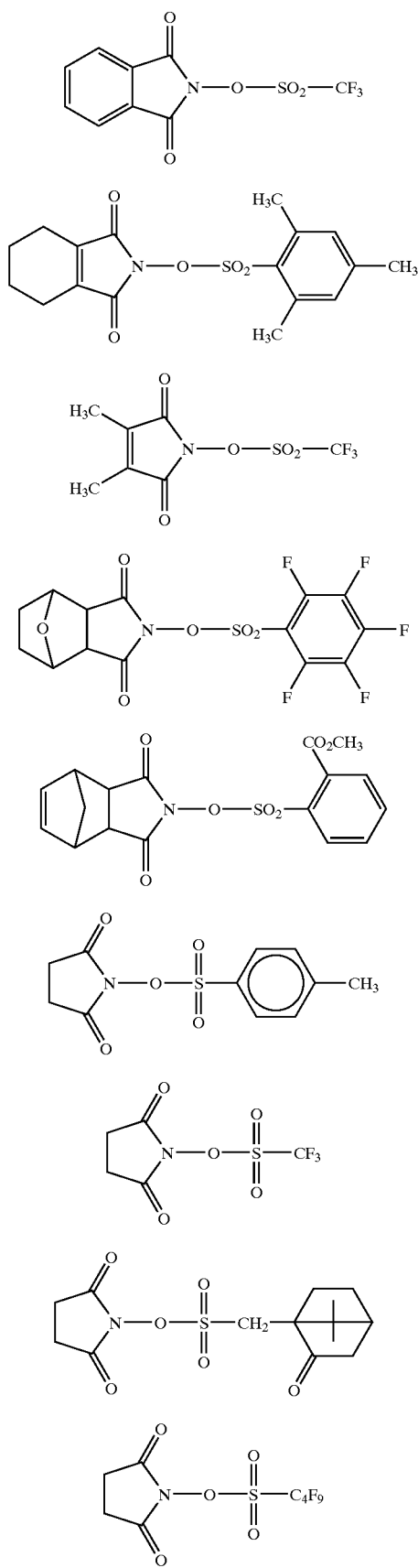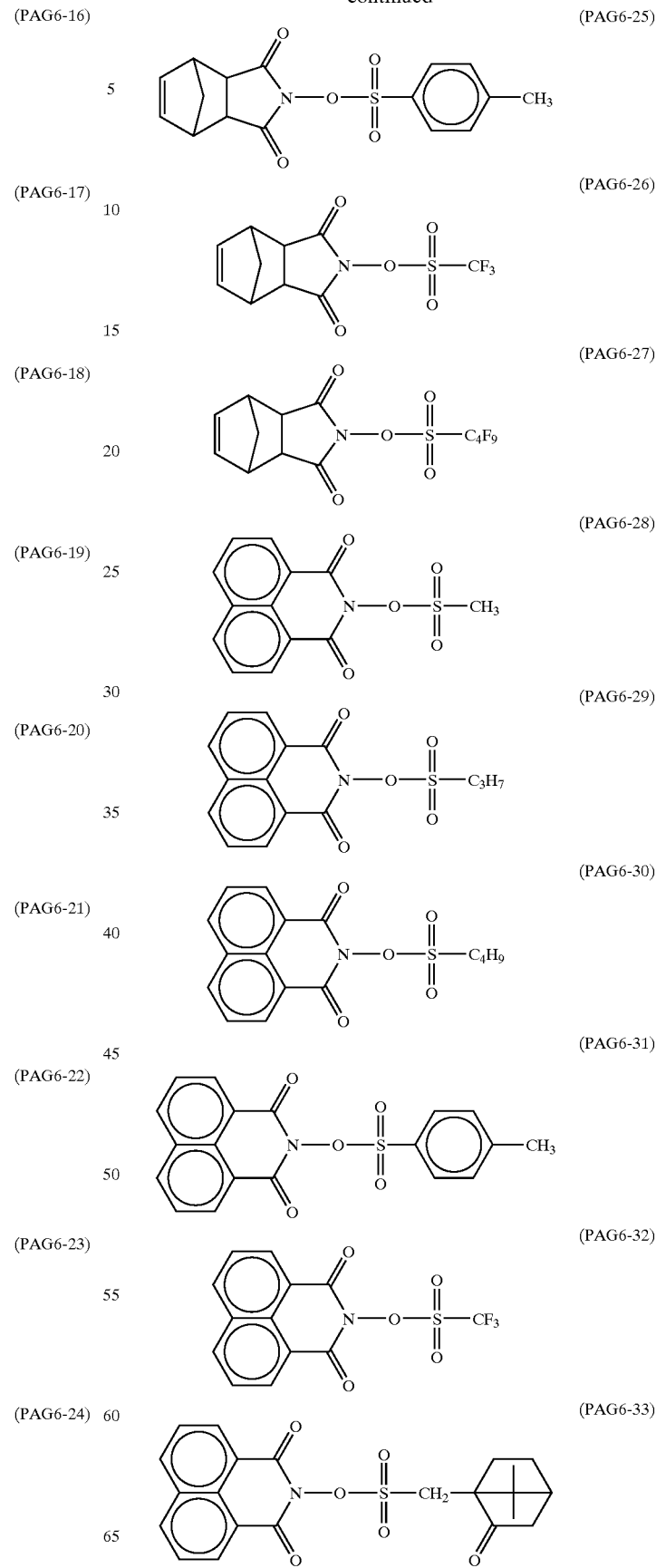

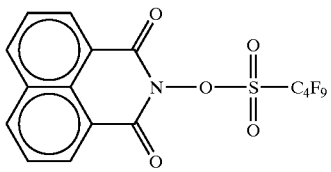

(PAG6-34)

(4) Diazodisulfone derivative represented by formula (PAG7) shown below:

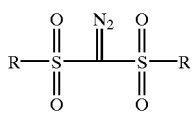

(PAG7)

In formula (PAG7), R represents a straight chain, branched or cyclic alkyl group or a substituted or unsubstituted aryl group.

Specific examples of such compounds are set forth below, but the present invention should not be construed as being limited thereto.

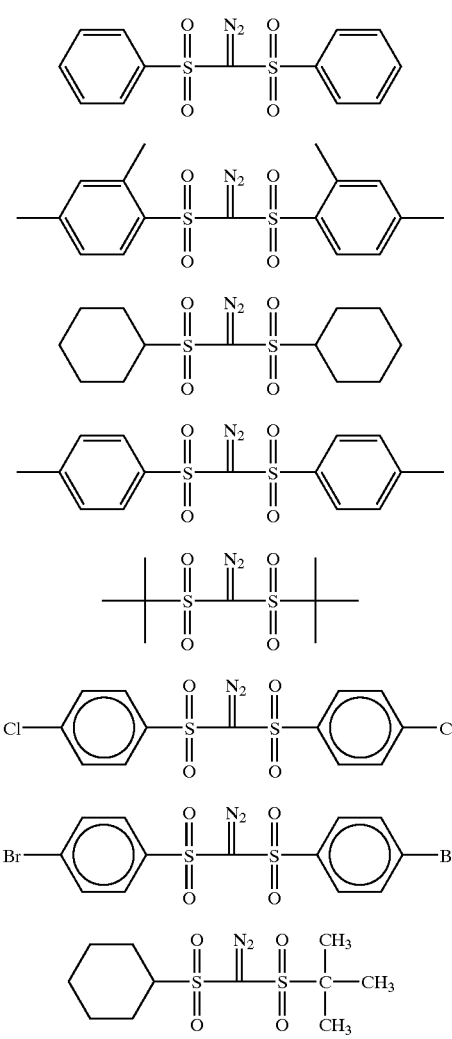

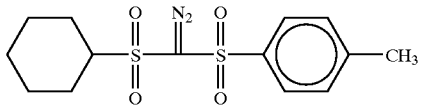

(PAG7-9)

The amount of the photo-acid generator added is ordinarily from 0.01 to 30% by weight, preferably from 0.3 to 20% by weight, and more preferably from 0.5 to 10% by weight, based on the total solid content of the positive resist composition.

When the amount of photo-acid generator added is less than 0.01% by weight, the sensitivity tends to decrease. On the other hand, when the amount of photo-acid generator added is more than 30% by weight, light absorption of the resist excessively increases to result in degradation of profile and narrow process margin (particularly, narrow bake margin).

[3] Other Additives

Into the positive resist composition of the present invention, other additives, for example, a surface active agent, an organic basic compound, an acid decomposable dissolution inhibiting compound, a dye, a plasticizer, a photosensitizer and a compound promoting solubility in a developing solution may be incorporated.

(C) Surface Active Agent

The positive resist composition of the present invention may contain a surface active agent, preferably a fluorine-based and/or silicon-based surface active agent.

It is preferred that the positive resist composition of the present invention contains one or more of a fluorine atom-containing surface active agent, a silicon atom-containing surface active agent and a surface active agent containing both a fluorine atom and a silicon atom.

The positive resist composition of the present invention containing the fluorine-based and/or silicon-based surface active agent in addition to the acid-decomposable resin is particularly effective for the formation of pattern having smaller linewidth, and development defect is further improved.

Specific examples of the surface active agent include those as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. Commercially available surface active agents described below may also be used as they are.

Examples of the commercially available surface active agent used include fluorine-based or silicon-based surface active agents, e.g., Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-based surface active agent.

The amount of surface active agent used is ordinarily from 0.001 to 2% by weight, and preferably from 0.01 to 1% by weight, based on the total solid content of the positive resist composition. The surface active agents may be used individually or in combination of two or more thereof.

Specific examples of suitable surface active agents other than the above-described fluorine-based and/or silicon-based surface active agent include a nonionic surface active agent, for example, a polyoxyethylene alkyl ether, e.g., polyoxyethylene lauryl ether, polyoxyethylene stearyl ether, polyoxyethylene cetyl ether or polyoxyethylene oleyl ether, a polyoxyethylene alkyl aryl ether, e.g., polyoxyethylene octyl phenol ether or polyoxyethylene nonyl phenol ether, a polyoxyethylene/polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tristearate, and a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The amount of such other surface active agent used is ordinarily not more than 2 parts by weight, and preferably not more than 1 part by weight per 100 parts by weight of the solid content of the positive resist composition.

(D) Organic Basic Compound

The organic basic compound preferably used in the present invention is a compound having basicity higher than phenol. Among others, nitrogen-containing basic compounds, for example, those having a structure represented by any one of formulae (A) to (E) shown below are preferred.

(A)

In the above formula, $R^{250}$, $R^{251}$ and $R^{252}$ which may be the same or different, each independently represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{251}$ and $R^{252}$ may be combined with each other to form a ring,

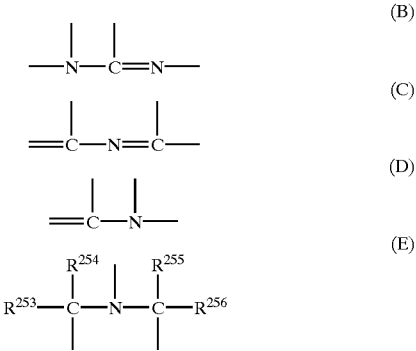

In the above formulae, $R^{253}$, $R^{254}$, $R^{255}$ and $R^{256}$, which may be the same or different, each independently represent an alkyl group having from 1 to 6 carbon atoms.

More preferred compounds are nitrogen-containing basic compounds having two or more nitrogen atoms having different chemical circumstances per molecule, and particularly preferred compounds are compounds having both a substituted or unsubstituted amino group and a cyclic structure containing a nitrogen atom and compounds having an alkylamino group.

Preferred examples of the organic basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines and substituted or unsubstituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Preferred specific examples of the nitrogen-containing basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0] undec-7-ene, 1,4-diazabicyclo[2.2.2]octane, 2,4,5-triphenylimidazole, a tertiary morpholine derivative, e.g., N-methylmorpholine, N-ethylmorpholine, N-hydroxyethylmorpholine, N-benzylmorpholine or cyclohexylmorpholinoethylthiourea (CHMETU), and a hindered amine as described in paragraph [0005] of JP-A-11-52575. However, the organic basic compounds for use in the present invention are not limited thereto.

Particularly preferred specific examples of the nitrogen-containing basic compound include 1,5-diazabicyclo[4.3.0] non-5-ene, 1,8-diazabicyclo[5.4.0]undec-7-ene, 1,4-diazabicyclo[2.2.2]octane, 4-dimethylaminopyridine, hexamethylenetetramine, 4,4-dimethylimidazoline, a pyrrole, a pyrazole, an imidazole, a pyridazine, a pyrimidine, a tertiary morpholine, e.g., CHMETU, and a hindered amine, e.g., bis(1,2,2,6,6-pentamethyl-4-piperidyl) sebacate.

Of these compounds, 1,5-diazabicyclo[4.3.0]non-5-ene, 1,8-diazabicyclo[5.4.0]undec-7-ene, 1,4-diazabicyclo[2.2.2] octane, 4-dimethylaminopyridine, hexamethylenetetramine, CHMETU and bis(1,2,2,6,6-pentamethyl-4-piperidyl) sebacate are more preferred.

The organic basic compounds may be used individually or as a mixture of two or more thereof. The amount of organic basic compound used is ordinarily from 0.001 to 10% by weight, and preferably 0.01 to 5% by weight, based on the total solid content of the positive resist composition of the present invention. When the amount is less than 0.001% by weight, an effect of the addition of organic basic compound is not obtained. When the amount exceeds 10% by weight, on the other hand, the sensitivity tends to decrease or the developability tends to degrade in the unexposed area.

The positive resist composition of the present invention is used by dissolving the above-described components in a solvent, which can dissolve the components, and coating the resulting solution on a substrate. Examples of the solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether (PGME), propylene glycol monomethyl ether acetate (PGMEA), ethylene carbonate, toluene, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. The solvents may be used individually or as a mixture of two or more thereof.

Among them, preferred solvents include propylene glycol monomethyl ether acetate, 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, ethylene carbonate, butyl acetate, methyl lactate, ethyl lactate, methyl methoxypropionate, ethyl ethoxypropionate, N-methylpyrrolidone and tetrahydrofuran.

The positive resist composition of the present invention is applied onto a substrate to form a thin film. The thickness of film is preferably from 0.2 to 1.2 μm.

A substrate for use in the present invention includes a conventional bare Si substrate, a SOG substrate and a substrate having a reflection preventing film as described below.

In the present invention, a known inorganic or organic reflection preventing film may be used, if desired. Suitable examples of the reflection preventing film include an inorganic film type, for example, titanium, titanium dioxide, titanium nitride, chromium oxide, carbon or amorphous silicon, and an organic film type comprising a light absorbent and a polymer material. The former requires an apparatus, for example, a vacuum deposition apparatus, a CVD apparatus or a sputtering apparatus, for the formation of reflection preventing film. The organic reflection preventing film includes, for example, a film comprising a condensate of a diphenylamine derivative with a formaldehyde-modified melamine resin, an alkali-soluble resin and a light absorbent as described in JP-B-7-69611 (the term "JP-B" as used herein means an "examined Japanese patent publication"), a film comprising a reaction product of a maleic anhydride copolymer with a diamine light absorbent as described in U.S. Pat. No. 5,294,680, a film comprising a resin binder and a methylolmelamine thermal crosslinking agent as described in JP-A-6-118631, a reflection preventing film of an acrylic resin containing a carboxylic acid group, an epoxy group and a light absorbing group within the same molecule as described in JP-A-6-118656, a film comprising methylolmelamine and a benzophenone light absorbent as described in JP-A-8-87115, and a film comprising a low molecular weight light absorbent added to a polyvinyl alcohol resin as described in JP-A-8-179509.

Also, a commercially available reflection preventing film, for example, DUV-30 Series, DUV-40 Series or ARC25 (manufactured by Brewer Science, Inc.) or AC-2, AC-3, AR19 or AR20 (manufactured by Shipley Co., Ltd.) is employed as the organic reflection preventing film.

A solution of the positive resist composition is applied to a substrate (e.g., silicon/silicon dioxide coating) having thereon, if desired, the reflection preventing film described above, as used for the production of a precision integrated circuit element by means of an appropriate coating method, for example, using a spinner or coater. After the application, the resulting photoresist layer is exposed to light through the desired mask, followed by baking and development. Thus, good resist patterns are obtained. As a light source for the exposure, light having a wavelength of from 150 to 250 nm is preferred. Specific examples thereof include a KrF excimer laser beam (248 nm), an ArF excimer laser beam (193 nm), an $F_2$ excimer laser beam (157 nm), an X-ray and an electron beam.

The developing solution for the positive resist composition of the present invention includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A developing solution prepared by adding an appropriate amount of an alcohol or a surface active agent to the above-described aqueous alkaline solution is also used.

The present invention is described in more detail with reference to the following examples, but the present invention should not be construed as being limited thereto.

SYNTHESIS EXAMPLE (1)

Synthesis of Resin (1)

A mixture of 2-adamantyl-2-propyl methacrylate, tert-butyl methacrylate, dihydroxyadamantane methacrylate and norbornanelactone acrylate in a molar ratio of 30/10/20/40 were dissolved in a mixed solvent of propylene glycol monomethyl ether acetate (PGMEA) and propylene glycol monomethyl ether (PGME) (1/1 by weight) to prepare 450 g of a solution having a solid concentration of 22% by weight. To the solution was added 1% by mole of an initiator (V-601 manufactured by Wako Pure Chemical Industries, Ltd.), and the solution was added dropwise to 40 g of a mixed solvent of propylene glycol monomethyl ether acetate (PGMEA) and propylene glycol monomethyl ether (PGME) (1/1 by weight) heated at 100° C. under a nitrogen gas stream over a period of 6 hours. After the completion of the dropwise addition, the reaction solution was stirred for 4 hours. Then, the reaction solution was cooled to room temperature and poured into 5 liters of a mixed solvent of hexane and ethyl acetate (9/1 by weight) to crystallize, and the white powder deposited was collected by filtration. The powder was slurried with one liter of methanol and the desired Resin (1) was recoverd.

A molar ratio of repeating units corresponding to 2-adamantyl-2-propyl methacrylate/tert-butyl methacrylate/ dihydroxyadamantane methacrylate/ norbornanelactone acrylate in the resin determined by NMR was 30/12/19/39. A weight average molecular weight thereof measured by a GPC method and calculated in terms of standard polystyrene was 11,600.

Resins (2) to (10) were synthesized in a similar manner to Synthesis Example (1) respectively. The molar ratio and weight average molecular weight of each of Resins (2) to (10) are shown in Table 1 below.

TABLE 1
| Resin | Repeating Unit of Formula (I) (mol %) | Repeating Unit of Formula (II) (mol %) | Repeating Unit of Formula (III) (mol %) | Repeating Unit having Alicyclic Lactone (mol %) | Other Repeating Unit (mol %) | Weight Average Molecular Weight |
|---|---|---|---|---|---|---|
| 2 | 26 | 11 | 20 | 43 | — | 10,700 |
| 3 | 43 | 15 | 23 | 19 | — | 9,900 |
| 4 | 29 | 19 | 36 | 16 | — | 10,300 |
| 5 | 23 | 21 | 20 | 36 | — | 10,100 |
| 6 | 53 | 22 | 25 | — | — | 11,400 |
| 7 | 32 | 13 | 19 | — | 36 | 9,700 |
| 8 | 49 | 35 | 16 | — | — | 9,900 |
| 9 | 42 | 20 | 18 | — | 20 | 11,600 |
| 10 | 26 | 20 | 21 | 33 | — | 10,100 |
Structures of Resins (1) to (10) are shown below.
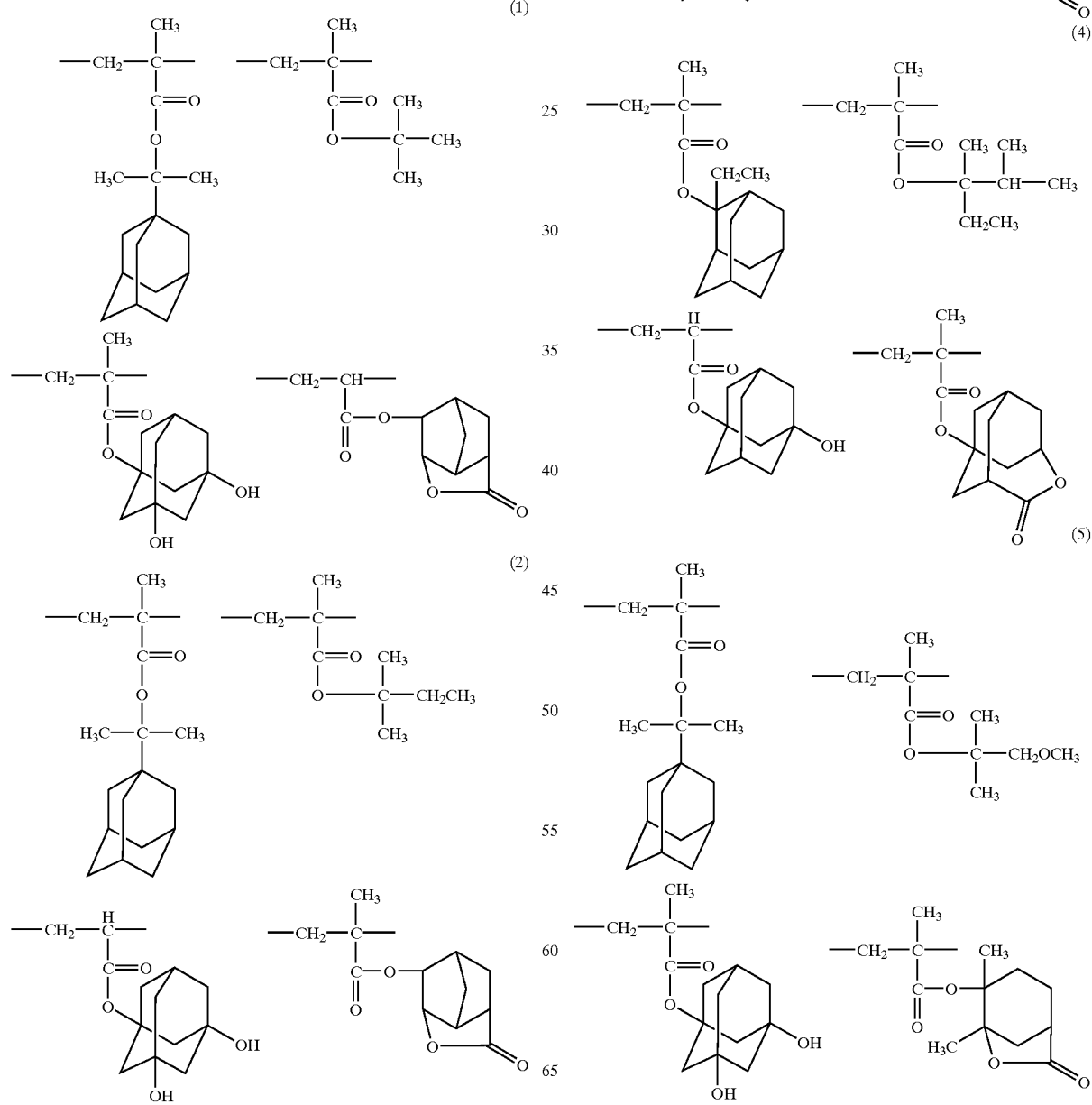

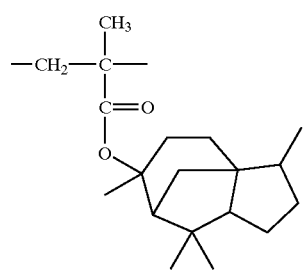
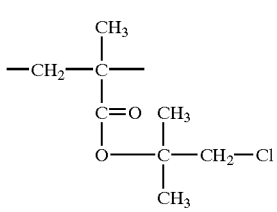
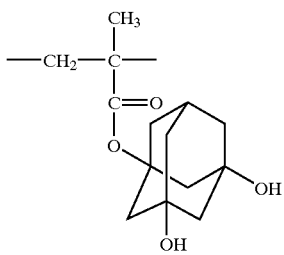

(6)

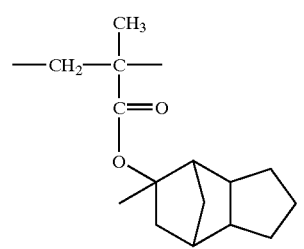
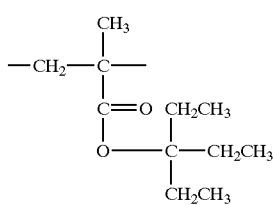
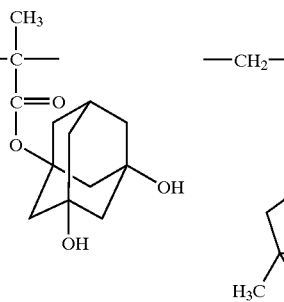

(7)

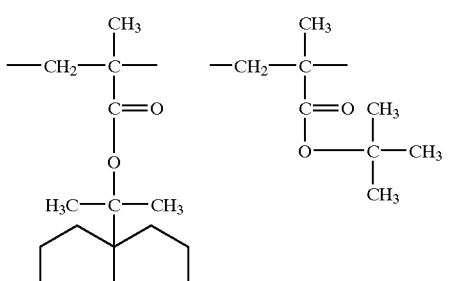
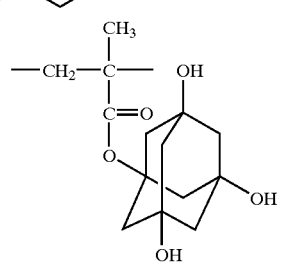

(8)

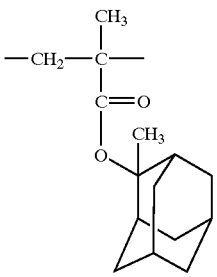
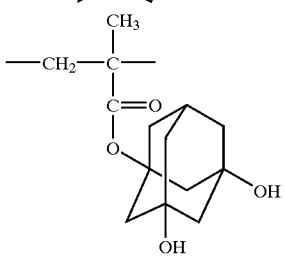
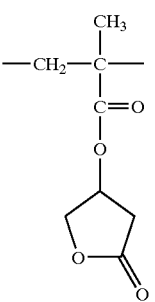
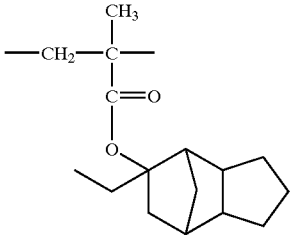
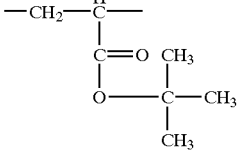
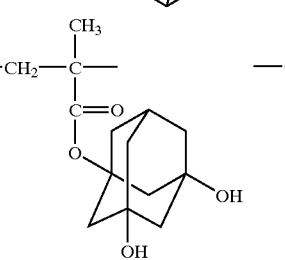

(9)

(10)

EXAMPLES 1 to 11 and COMPARATIVE EXAMPLE 1

<Preparation and Evaluation of Positive Resist Composition>

A composition of 2 g of the resin synthesized in Synthesis Example above, a photo-acid generator in an amount shown in Table 2, 4 mg of an organic basic compound and, if desired, 10 mg of a surface active agent, as shown in Table 2 was dissolved in a solvent as shown in Table 2 to prepare a solution having a solid content of 14% by weight. The resulting solution was filtered through a microfilter having a pore size of 0.1 μm, whereby a positive resist composition for each of Examples 1 to 11 and Comparative Example 1 was prepared. In case of using plural compounds as each of the components, a ratio of the compounds is indicated by weight in Table 2.

Resin R1 used in Comparative Example 1 is a copolymer synthesized according to the preparation method of Copolymer 3 described in Examples of JP-A-11-119434.

TABLE 2

| | Resin (2 g) | Photo-Acid Generator | Basic Compound (4 mg) | Surface Active Agent (10 mg) | Solvent |
|---|---|---|---|---|---|
| Example 1 | (1) | PAG4-48/PAG4-95 = 40/5 mg | 3 | W5 | PGMEA/PGME = 8/2 |
| Example 2 | (2) | PAG4-96/PAG4-65 = 23/100 mg | 6 | W1 | PGMEA/PGME = 7/3 |
| Example 3 | (3) | PAG4-39 = 43 mg | 4 | W2 | PGMEA/PGME = 6/4 |
| Example 4 | (4) | PAG4-96 = 46 mg | 5 | W5 | PGMEA/PGME/γ-Butyrolactone = 8/1/1 |
| Example 5 | (5) | PAG4-95 = 47 mg | 4/5 = 1/1 | W5 | PGMEA/PGME/Ethylene carbonate = 7/2/1 |
| Example 6 | (6) | PAG4-95/PAG4-53 = 36/20 mg | 2 | W3 | PGMEA |
| Example 7 | (7) | PAG4-94 = 43 mg | 1 | W5 | PGMEA/PGME = 8/2 |
| Example 8 | (8) | PAG4-50 = 50 mg | 3 | W4 | PGMEA/PGME = 6/4 |
| Example 9 | (9) | PAG4-48/PAG4-78 = 38/10 mg | 6 | W3 | PGMEA/PGME = 7/3 |
| Example 10 | (10) | PAG4-52 = 44 mg | 3/6 = 1/1 | W5 | PGMEA/PGME = 7/3 |
| Example 11 | (1) | PAG4-48/PAG4-60 = 40/3 mg | 6 | W5 | PGMEA/PGME = 7/3 |
| Comparative Example 1 | R1 | PAG4-5 = 40 mg | None | None | PGMEA |

Explanation of the abbreviations in Table 2:
Surface Active Agent:

W-1: Megafax F176 (manufactured by Dainippon Ink and Chemicals, Inc.) (fluorine-based)
W-2: Megafac R08 (manufactured by Dainippon Ink and Chemicals, Inc.) (fluorine- and silicon-based)
W-3: Polysiloxane Polymer KP-341 (manufactured by Shin-Etsu Chemical Co., Ltd.) (silicon-based)
W-4: Polyoxyethylene nonyl phenyl ether
W-5: Troysol S-366 (manufactured by Troy Chemical Co., Ltd.)

Basic Compound:

1: 1,5-Diazabicyclo[4.3.0]-5-nonene (DBN)
2: Bis(1,2,2,6,6-pentamethyl-4-piperidyl) sebacate
3: Trioctylamine
4: Triphenylimidazole
5: Antipyrine
6: 2,6-Diisopropylaniline Solvent:

PGMEA: Propylene glycol methyl ether acetate
PGME: Propylene glycol methyl ether <Evaluation Test>

On a silicon wafer was coated a reflection preventing film (ARC-29 manufactured by Brewer Science, Inc.) having a thickness of 85 nm by a spin coater, followed by drying. On the reflection preventing film was coated each of the positive resist compositions described above by a spin coater and dried at 120° C. for 90 seconds to prepare a positive photoresist film having a thickness of about 0.4 $\mu$m. The photoresist film was exposed using an ArF excimer laser (ArF Stepper manufacture by ISI Co., Ltd.; wavelength: 193 nm; NA=0.6) and subjected to a heat treatment at 120° C. for 90 seconds after the exposure. Then the photoresist film was developed with a 2.38% by weight aqueous tetramethylammonium hydroxide solution, rinsed with distilled water, and dried to obtain a resist pattern profile.

The resist pattern was observed by a scanning electron microscope and the evaluation was conducted in the following manner.

(Pattern Collapsing)

An exposure amount (E1) necessary for reproducing a mask pattern of 0.13 $\mu$m (line/space=1/1) was determined. Then, the focus was changed in a range of ±0.4 $\mu$m on the overexposure side of E1 to observe pattern collapsing by a scanning electron microscope (SEM) and an exposure amount (E2) at which the pattern collapsing occurred was determined. A value of [(E2−E1)/E1]×100 (%) was used as an index of the pattern collapsing. AS the value is lager, the occurrence of pattern collapsing is small and preferable.

(Pitch Dependency)

A line width (L1) of isolated pattern of 0.13 $\mu$m was measured in the exposure amount necessary for reproducing a mask pattern of 0.13 μm (line/space=1/1). A rate of variation from 0.13 μm, i.e., [(0.13−L1)/0.13]×100 (%) was used as an index of the pitch dependency. As the value is smaller, the pitch dependency is small and preferable.

(Surface Roughness After Etching)

A contact hole pattern of 0.15 μm was etched with plasma of $CHF_3/O_2$=14/6 for 60 seconds. A section and surface of the sample obtained were observed by SEM and evaluated according to the following criteria:

×: Pinhole-like defects (underlayer was etched in the area where the processing would not be planned) were observed.
Δ: Surface roughness and deformation of hole were observed, but the pinhole-like defect was not observed.
○: Small surface roughness was observed, but the deformation of hole was not observed.

The results obtained are shown in Table 3 below.

TABLE 3

| | Pattern Collapsing (%) | Surface Roughness after Etching | Pitch Dependency (%) |
|---|---|---|---|
| Example 1 | 11 | ○ | 4.5 |
| Example 2 | 12 | ○ | 3 |
| Example 3 | 10 | ○ | 6 |
| Example 4 | 10 | ○ | 6 |
| Example 5 | 12 | ○ | 3 |
| Example 6 | 8 | ○ | 8 |
| Example 7 | 9 | ○ | 7 |
| Example 8 | 6 | Δ | 10 |
| Example 9 | 8 | ○ | 8 |
| Example 10 | 10 | ○ | 6 |
| Example 11 | 12 | ○ | 3.5 |
| Comparative Example 1 | 2 | × | 40 |

It is apparent from the results shown in Table 3 that the positive resist composition of the present invention is remarkably improved in the pattern collapsing, surface roughness after etching and pitch dependency.

According to the present invention, a positive resist composition in which the pattern collapsing, surface roughness after etching and pitch dependency are improved can be provided.

The positive resist composition of the present invention is suitably employed in microfabrication using exposure of a far ultraviolet ray, especially an ArF excimer laser beam.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive resist composition comprising (A) a resin, which increases a solubility rate in an alkali developing solution by the action of an acid, containing a repeating unit represented by formula (I) shown below, a repeating unit represented by formula (II) shown below and a repeating unit represented by formula (III) shown below, and (B) a compound that generates an acid upon irradiation of an actinic ray or radiation

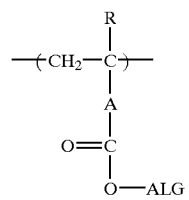

wherein, R represents a hydrogen atom or a methyl group; A represents a single bond or a connecting group; and ALG represents any one of the groups represented by the following formulae (pI) to (pV):

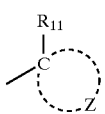

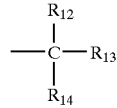

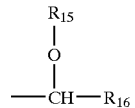

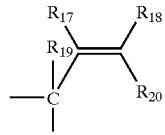

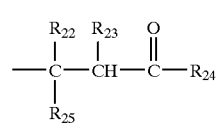

wherein, $R_{11}$ represents a methyl group, an ethyl group, an n-propyl group, an isobutyl group or a sec-butyl group; Z represents an atomic group necessary for forming an alicyclic hydrocarbon group together with the carbon atom; $R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group; $R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring;

(II)

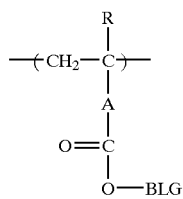

wherein, R represents a hydrogen atom or a methyl group; A represents a single bond or a connecting group; and BLG represents a chain tertiary alkyl group;

(III)

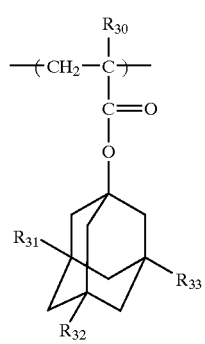

wherein, $R_{30}$ represent a hydrogen atom or a methyl group; $R_{31}$ to $R_{33}$ each independently represent a hydrogen atom, a hydroxy group or an alkyl group, provided that at least one of $R_{31}$ to $R_{33}$ represents a hydroxy group.

2. The positive resist composition as claimed in claim 1, wherein the resin of component (A) further contains a repeating unit including cyclohexane lactone, norbornane lactone or adamantane lactone.

3. The positive resist composition as claimed in claim 1, wherein two of $R_{31}$ to $R_{33}$ in the repeating unit represented by formula (III) each represent a hydroxy group.

4. The positive resist composition as claimed in claim 1, wherein A and ALG in formula (I) represent a single bond and a group represented by a formula shown below, respectively;

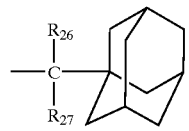

wherein $R_{26}$ to $R_{27}$ each independently represent a straight chain or branched alkyl group having from 1 to 4 carbon atoms.

5. The positive resist composition as claimed in claim 2, wherein the repeating unit including cyclohexane lactone is a repeating unit having a group represented by the following formula (V-1) or (V-2):

(V-1)

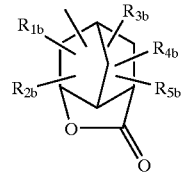

(V-2)

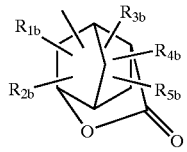

wherein $R_{1b}$, $R_{2b}$, $R_{3b}$, $R_{4b}$ and $R_{5b}$, which may be the same or different, each represent a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring.

6. The positive resist composition as claimed in claim 2, wherein the repeating unit including norbornane lactone is a repeating unit having a group represented by the following formula (V-3) or (V-4):

(V-3)

(V-4)

wherein $R_{1b}$, $R_{2b}$, $R_{3b}$, $R_{4b}$ and $R_{5b}$, which may be the same or different, each represent a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring.

7. The positive resist composition as claimed in claim 2, wherein the repeating unit including adamantane lactone is a repeating unit represented by the following formula (VI):

(VI)

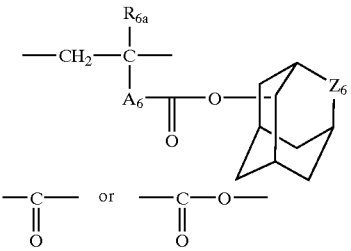

wherein, $A_6$ represents a single bond, an alkylene group, a cycloalkylene group, an ether group, a thioether group, a carbonyl group, an ester group or a combination of two or 8. The positive resist composition as claimed in claim 1, wherein the resin of component (A) further contains a repeating unit including a lactone structure represented by the following formula (IV):

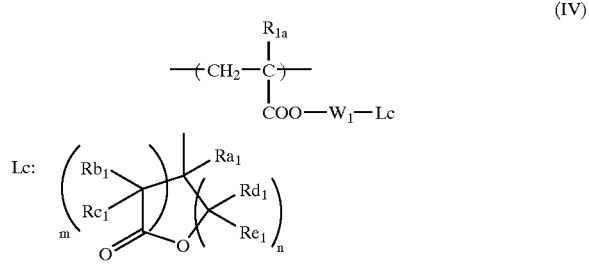

(IV)

wherein $R_{1a}$ represents a hydrogen atom or a methyl group; $W_1$ represents a single bond, an alkylene group, an ether group, a thioether group, a carbonyl group, an ester group or a combination of two or more thereof; $R_{a1}$, $R_{b1}$, $R_{c1}$, $R_{d1}$, and $R_{e1}$, which may be the same or different, each independently represent a hydrogen atom or an alkyl group having from 1 to 4 carbon atoms; and m and n, which may be the same or different, each independently represent an integer of from 0 to 3, provided that the sum total of m and n is from 2 to 6.

9. The positive resist composition as claimed in claim 1, wherein the compound that generates an acid upon irradiation of an actinic ray or radiation of component (B) is a compound selected from an onium salt, an organic halogeno compound, an organo-metal/organic halide compound, a photo-acid generator having an o-nitrobenzyl type protective group, a compound generating a sulfonic acid upon photolysis, a disulfone compound, a diazoketosulfone compound and a diazodisulfone compound.

10. The positive resist composition as claimed in claim 1, wherein the compound that generates an acid upon irradiation of an actinic ray or radiation of component (B) is a sulfonium salt.

11. The positive resist composition as claimed in claim 1, wherein the positive resist composition further comprises a surface active agent.

12. The positive resist composition as claimed in claim 11, wherein the surface active agent is a fluorine-based and/or silicon-based surface active agent.

13. The positive resist composition as claimed in claim 1, wherein the positive resist composition further comprises an organic basic compound.

14. The positive resist composition as claimed in claim 13, wherein the organic basic compound is a compound selected from compounds having a structure represented by any one of the following formulae (A) to (E):

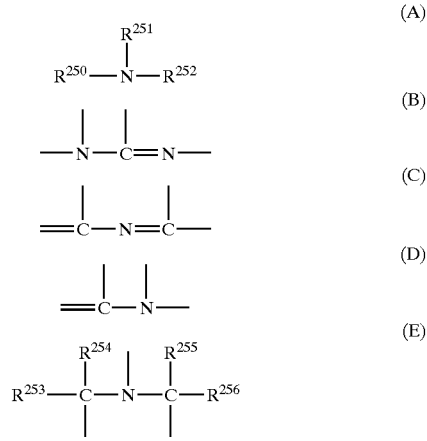

wherein $R^{250}$, $R^{251}$ and $R^{252}$, which may be the same or different, each independently represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{250}$ and $R^{251}$ may be combined with each other to form a ring, and $R^{253}$, $R^{254}$, $R^{255}$ and $R^{256}$, which may be the same or different, each independently represent an alkyl group having from 1 to 6 carbon atoms.

15. The positive resist composition as claimed in claim 1, wherein the positive resist composition further comprises an organic solvent.

* * * * *